(12) United States Patent
Komori

(10) Patent No.: US 7,230,289 B2
(45) Date of Patent: Jun. 12, 2007

(54) SOLID-STATE IMAGING DEVICE AND METHOD OF MANUFACTURING THE SAME

(75) Inventor: Hirofumi Komori, Kanagawa (JP)

(73) Assignee: Innotech Corporation, Yokohama-shi (JP)

(*) Notice: Subject to any disclaimer, the term of this patent is extended or adjusted under 35 U.S.C. 154(b) by 244 days.

(21) Appl. No.: 10/849,238

(22) Filed: May 20, 2004

(65) Prior Publication Data

US 2004/0235215 A1 Nov. 25, 2004

(30) Foreign Application Priority Data

May 22, 2003 (JP) ............................... 2003-145027
Dec. 12, 2003 (JP) ............................... 2003-415567

(51) Int. Cl.
H01L 31/062 (2006.01)
H01L 21/113 (2006.01)

(52) U.S. Cl. .............................. 257/292; 257/E25.032; 257/E27.133

(58) Field of Classification Search ............... 348/308; 346/301, 310; 250/208.1; 257/225, 229, 257/290–293, 463, 458, 462, 231–233
See application file for complete search history.

(56) References Cited

U.S. PATENT DOCUMENTS 5,122,881 A * 6/1992 Nishizawa et al. ......... 348/301
5,892,253 A * 4/1999 Merrill ....................... 257/292
6,504,194 B1 1/2003 Miida

* cited by examiner

Primary Examiner—B. William Baumeister
Assistant Examiner—Dana Farahani
(74) Attorney, Agent, or Firm—Birch, Stewart, Kolasch & Birch, LLP

(57) ABSTRACT

The MOS type solid-state imaging device has plural pixels each of which comprises a photo-diode and a MOS transistor on a substrate. A gate electrode is formed on the channel dope layer formed in the surface of the p-type well layer. By ion implantation of n-type impurity ions via the gate electrode as the mask, the n-type source region and the drain region are formed in the region corresponding to the MOS transistor, and the n-type impurity region is also formed in the region corresponding to the photo-diode. In the well layer, a high impurity density region as a hole pocket is self-aligned to the gate electrode.

8 Claims, 26 Drawing Sheets

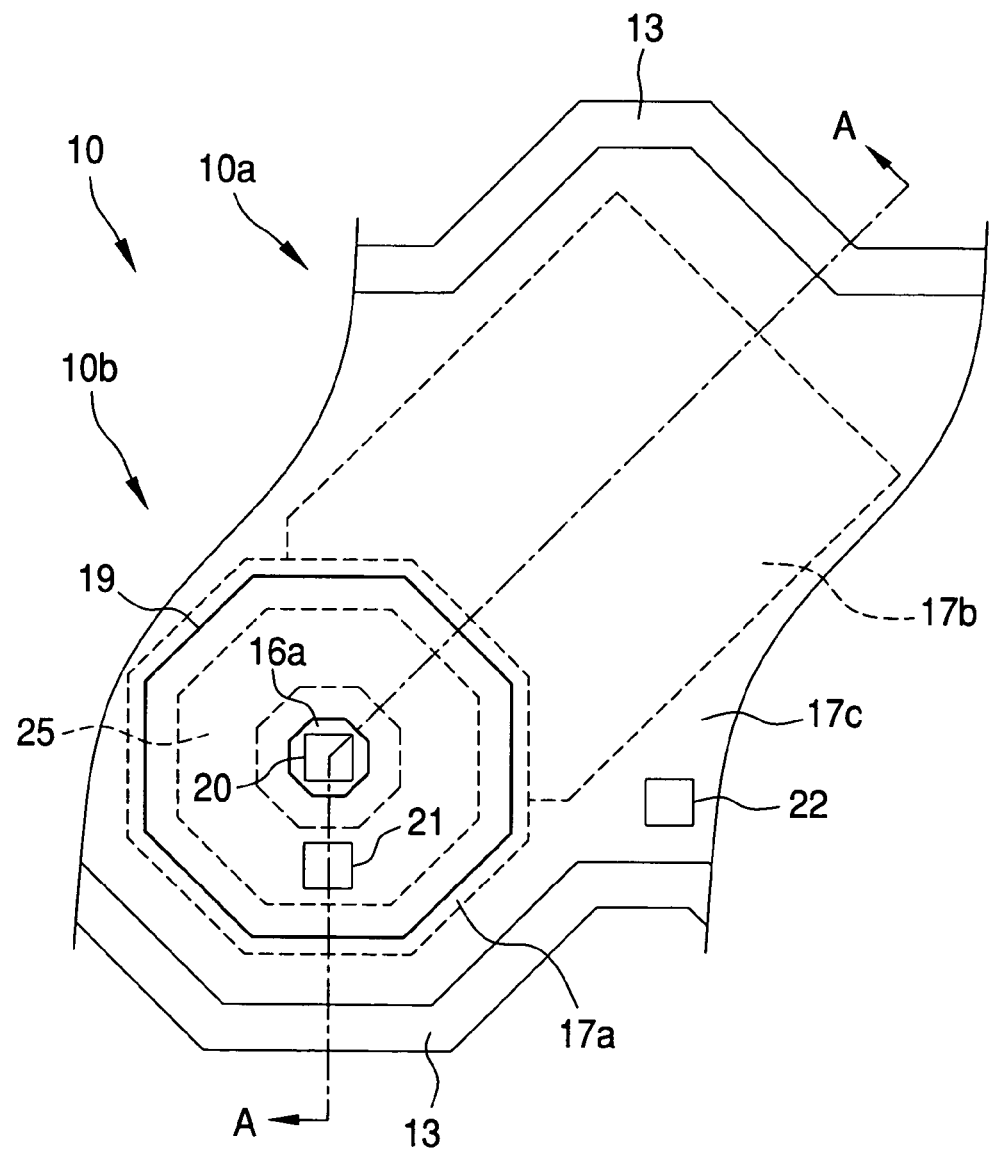

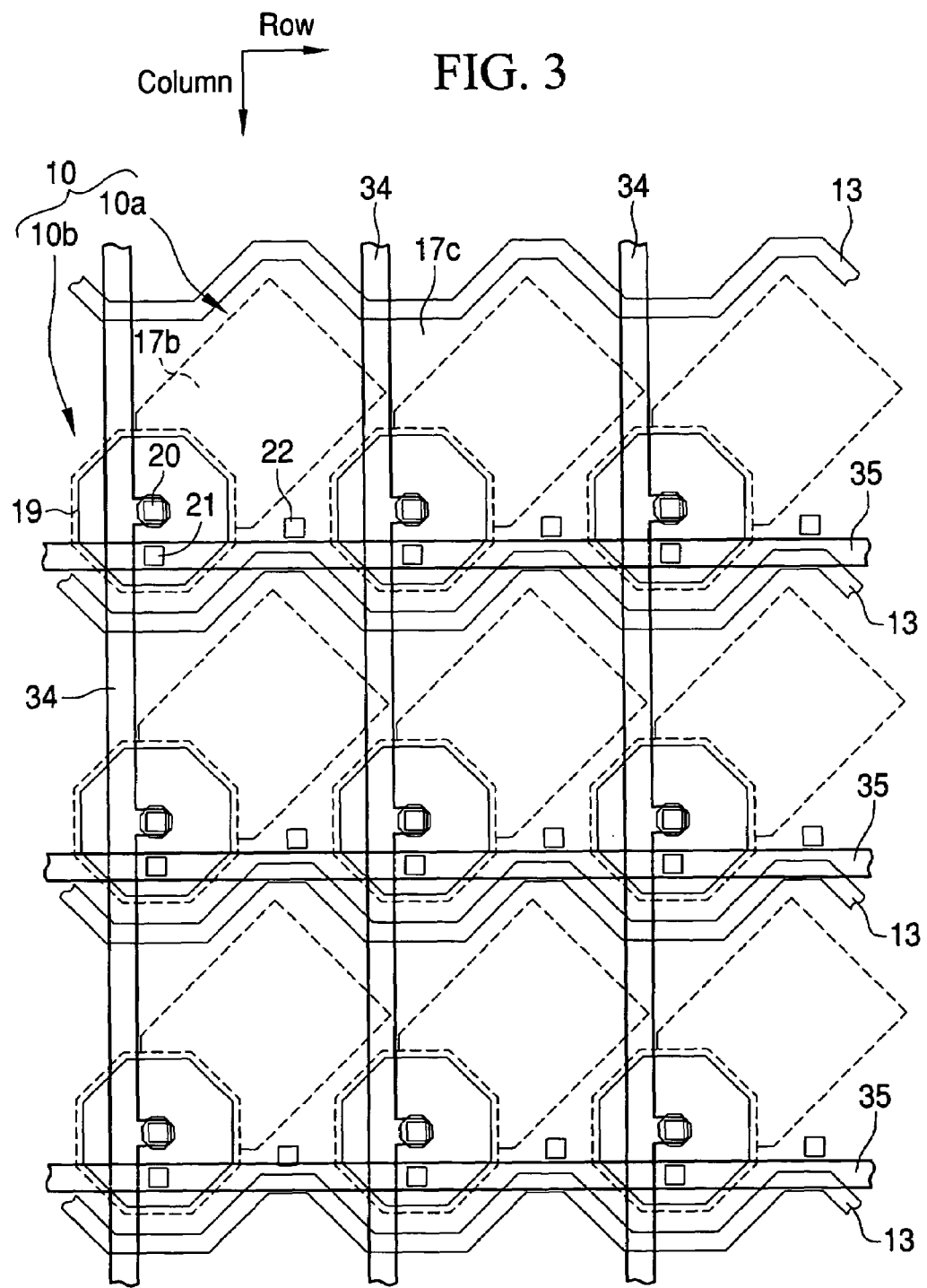

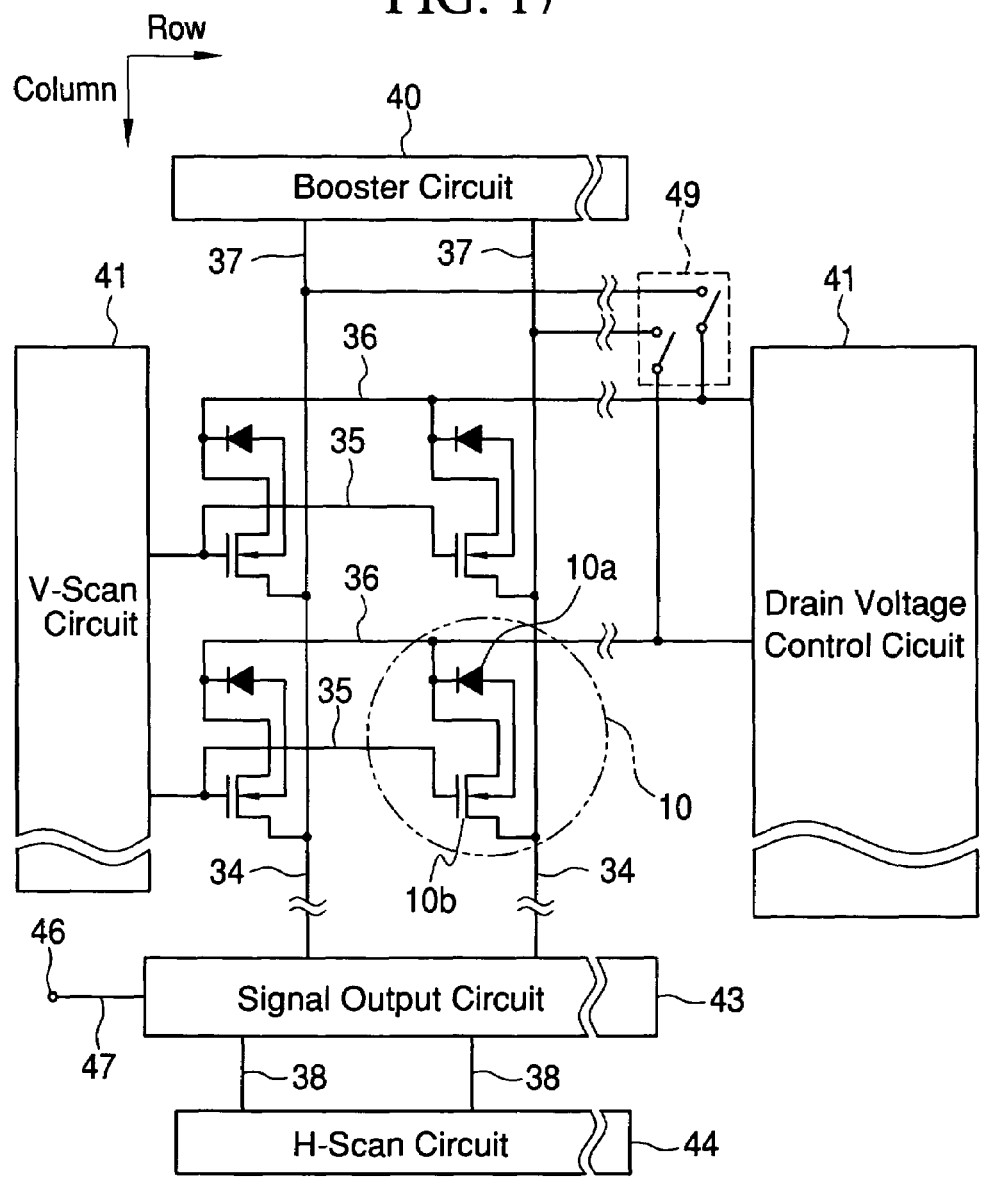

SOLID-STATE IMAGING DEVICE AND METHOD OF MANUFACTURING THE SAME

This Non-provisional application claims priority under 35 U.S.C. § 119(a) on Patent Application No(s). 2003-145027 and 2003-415567 filed in Japan on May 22, 2003 and Dec. 12, 2003, the entire contents of which are hereby incorporated by reference.

BACKGROUND OF THE INVENTION

1. Field of the Invention

The present invention relates to a threshold modulation type solid-state imaging device for use in video cameras, digital cameras, scanners, camera-equipped mobile phones, or the like, and to a method of manufacturing such solid-state imaging device.

2. Description of Related Art

Solid-state imaging devices of charged coupled device (CCD) type and metal oxide silicon (MOS) type have been widely used in most image input devices due to excellent mass productivity using advanced fine patterning techniques. Especially, the MOS type solid-state imaging devices have gained a great deal of attention because of the advantages that MOS type solid-state imaging devices have lower power consumption than the CCD type, and that they can be easily incorporated in peripheral circuit therefor by use of common complementary MOS (CMOS) fabrication technique.

On account of these advantages, MOS type solid-state imaging devices have been improved. For example, U.S. Pat. No. 6,504,194 (counterpart of Japan Patent No. 3315962) describes the MOS type solid-state imaging device in which a carrier pocket (hole pocket) is formed below the channel region of the MOS type transistor to accumulate photo-generated charges (holes) transferred from a charge generating region. This solid-state imaging device, as shown in FIG. 26, comprises plural pixels each of which is provided with a photo-diode 110a and a MOS type transistor 110b as a photo-detector. On an n-type (one conductive type) well layer 112 in each pixel, p-type (opposite conductive type) well layers 115a, 115n are formed. In the photo-diode 110a side, an n-type impurity layer 117b is provided on the surface region of the p-type well layer 115a so as to form an embedded structure to photo-generated charges in the photo-diode 110a. In the MOS transistor 110b side, a ring-shaped gate electrode 119 is formed on the p-type well layer 115b via an insulation layer 118. An n-type source region 116a formed on the p-type well layer 115b is surrounded by the ring-shaped gate electrode 119. On the other hand, an n-type drain region 117a is formed on the surface region of the p-type well layer 115b outside the gate electrode 119. The drain region 117a is extended laterally so that the drain region 117a is integrated with the impurity layer 117b in the photo-diode 110a.

Below the gate electrode 119 is formed an n-type channel dope layer 115c. High density p-type impurities are implanted (introduced) in the well layer 115b below the channel dope layer 115c, so that a hole pocket 125 is formed in the vicinity of the source region 116a. Photo-generated holes generated by light irradiation in the photo-diode 110a is accumulated in the hole pocket 125. The threshold voltage (corresponding to the source potential) of the MOS type transistor 110b depends on the amount of photo-generated charges accumulated in the hole pocket 125. Thus, it is possible to obtain image signals by detecting the source potential that is changed in accordance with the threshold voltage.

Recently, because of strong demand for miniaturization and improvement in image quality of the MOS type imaging device, it is necessary to miniaturize the pixel size and to accumulate the pixels. Suppose that the pixel size of 4.2 µm is miniaturized to 3.0 µm, the width of the gate electrode of 1.35 µm needs to be 0.5 µm. Smaller gate width makes it difficult to form resist masks having openings corresponding to the carrier pockets. It is also difficult to align the resist masks to the gate electrodes precisely. In the event of forming the carrier pocket by implanting the impurity ions through the opening formed in the resist mask, the position of the carrier pocket is varied from the designed position. Such variation in the position of the carrier pocket changes the threshold voltage caused by the accumulated charges, so the noise in output image signal will increase.

SUMMARY OF THE INVENTION

An object of the present invention is to provide a solid-state imaging device that is capable of forming carrier pockets (high impurity density region) easily and precisely.

Another object of the present invention is to provide a solid-state imaging device suitable for accumulating the unit pixels.

Further object of the present invention is to provide a method for manufacturing such solid-state imaging device.

In order to achieve the above objects, the solid-state imaging device equipped with plural unit pixels formed on the second semiconductor layer of opposite conductive type on a first semiconductor layer of one conductive type, and the unit pixel comprises a photo diode for generating charges by light illumination and a photo-detecting transistor for generating a signal potential that changes in accordance with the amount of the charges in the high impurity density region that is formed by self-alignment to a gate electrode.

In the preferable embodiment, the photo-diode comprises one conductive impurity layer provided in the surface of the second semiconductor layer. The photo-detecting transistor comprises the gate electrode formed on the second semiconductor layer via an insulation film, a source region and drain region that are one conductive type and formed in the surface of the second semiconductor layer, a channel dope layer of one conductive type provided in the area between the source and drain regions in the surface of the second semiconductor layer. The drain region and the impurity layer are connected to each other. In addition, the high impurity density region of opposite conductive type is formed in the semiconductor layer below the channel dope layer. The source region and the drain region are formed by self-alignment to the gate electrode.

The solid-state imaging device may have a semiconductor substrate of opposite conductive type on which the first semiconductor layer is formed, a first buried layer of one conductive type formed in the photo-diode side and a second buried layer of opposite conductive type formed in the photo-detecting transistor side. The first and second buried layers are connected to the bottom edge of the first semiconductor layer and buried in the semiconductor substrate.

The plural unit pixels can be arranged in first and second directions to form a matrix, and the solid-state imaging device may be provided with a first line to connect the unit pixels arranged in the first direction to one another, a second line to connect the unit pixels arranged in the second direction to one another, and a third line to connect the drain regions of all unit pixels. A voltage supply circuit may be provided to supply voltages to carry out the steps of transferring the charges from the photo-diode to the high impurity density region, generating a first signal potential in the source region according to the charge amount in the high impurity density region, eliminating the charges out of the high impurity density region, and generating a second signal potential in the source region after charge elimination. Moreover, a signal output circuit is provided to output image signal by subtracting the second signal potential from the first signal potential.

The solid-state imaging device may have a switch circuit to connecting or disconnecting the first line and the third line. The voltage to the gate electrode is boosted in eliminating the charges by connecting the first line to the third line and by applying a voltage to the source and drain regions simultaneously while keeping the gate electrode at a high impedance state.

The solid-state imaging device may be provided with an impurity region of one conductive type that is connected to the impurity layer and the drain region. Adjacent unit pixels have the impurity region in common so that the drain regions of all unit pixels are connected to one another via the regions of same conductive type.

Such solid-state imaging device may be manufactured by the following steps. The gate electrode is formed on the insulation film in the area corresponding to the photo-detecting transistor. Then, the source region and the drain region of one conductive type are formed in the area corresponding to the photo-detecting transistor by implanting one conductive type impurities in the surface of the second semiconductor layer via the gate electrode as the mask. The high impurity density region of opposite conductive type is formed by self-alignment to the gate electrode by forming an impurity layer of one conductive layer in the region corresponding to the photo-diode. The high impurity density region is provided in the second semiconductor layer below the dope layer that is covered with the gate electrode.

The first buried layer may be formed in the semiconductor substrate by implanting impurities of one conductive type to the semiconductor substrate in the region corresponding to the photo-diode. Also, the second buried layer buried in the semiconductor substrate may be formed by implanting impurities of opposite conductive type to the semiconductor substrate in the region corresponding to the photo-detecting transistor.

The condition to implant the opposite conductive type impurities in the source region may be different from that in the drain region, so that the position of the high impurity region is shifted to the source region compared with the case in which the condition to implant the opposite conductive type impurities are the same.

According to the present invention, since the high impurity density region in the photo-detecting transistor is formed by self-alignment, the position of the high impurity density region becomes more precise. Moreover, since adjacent unit pixels have the impurity region in common and the drain regions of all unit pixels are connected to one another via the regions of same conductive type, the pixel isolation region is not needed, and thus accumulation of unit pixels can be achieved.

BRIEF DESCRIPTION OF THE DRAWINGS

The above objects and advantages of the present invention will become easily understood by one of ordinary skill in the art when the following detailed description would be read in connection with the accompanying drawings, in which:

FIG. 1 is a plan view showing the layout of a unit pixel of a solid state imaging device according to first embodiment of the present invention;

FIG. 3 is a plan view showing the two-dimensional arrangement of the unit pixels;

FIG. 17 is a circuit diagram of the solid-state imaging device according to second embodiment;

PREFERRED EMBODIMENTS OF THE INVENTION

The embodiment of the present invention is described in detail hereinafter with reference to the accompanying drawings.

Figures 2A, 2B:
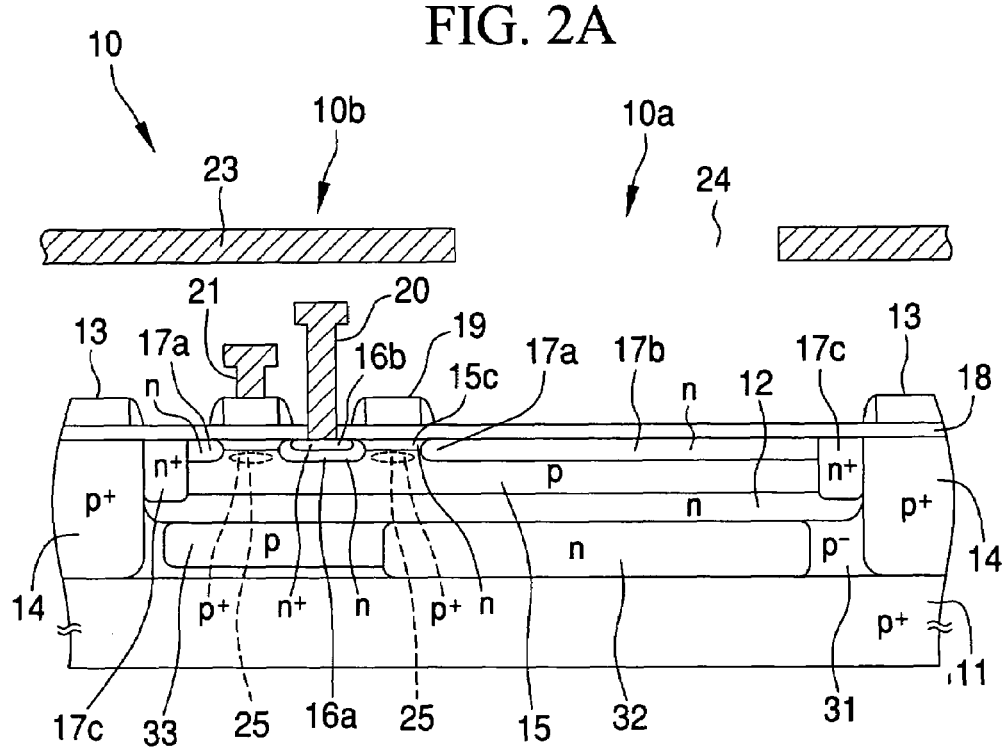
FIG. 2A is a cross section, taken along the line A—A of FIG. 1, to illustrate the structure of the unit pixel.
FIG. 2B is the potential profile in the unit pixel along the line A—A of FIG. 1.

In FIGS. 1 and 2A that show a layout of a unit pixel of the solid-state imaging device, the unit pixel 10 includes a photo-diode 10a and a photo-signal detecting MOS transistor 10b that are adjacently provided in a p-type (opposite conductive type) well layer 15. The photo-diode 10a serves as an area to generate electron-hole pairs (photo-generated charges) by light illumination. The MOS transistor 10b is coupled to the photo-diode 10a, and the threshold voltage (source potential) thereof is modulated in accordance with the potential caused by the holes accumulated in a hole pocket 25. The hole pocket 25 is formed below the channel region of the MOS transistor 10b. The image signals are obtained by detecting the source potential.

A gate electrode 19 of the MOS transistor 10b has octagonal ring-shaped inner edge and outer edge. The gate electrode 19 is connected to a plug 21. An n-type (one conductive type) source region 16a, connected to a plug 20, is provided in the region surrounded by the inner edge of the gate electrode 19. An n-type drain region 17 having low impurity density is so formed as to surround the inner and outer edges of the gate electrode 19.

In the photo-diode 10a, an n-type impurity layer 17b is integrally formed with the drain region 17a. The n-type impurity layer 17b has substantially same impurity density as the drain region 17a. The drain region 17a and the n-type impurity layer 17b are surrounded by an n$^+$-type impurity region 17c that has low resistance and high impurity density and serves as a contact layer of the plug 22. The hole pocket 25 is a localized p$^+$-type region with high impurity density below the gate electrode 19.

Referring FIG. 2A showing a cross section of the unit pixel 10 taken along the line A—A in FIG. 1, a p$^-$-type silicon as an epitaxial layer 31 is epitaxially deposited on a p$^+$-type silicon substrate 11. The epitaxial layer 31 has a lower impurity density than the substrate 11. The substrate 11 and the epitaxial layer 31 serve as a p-type semiconductor substrate.

The photo-diode 10a comprises an n-type buried layer (first buried layer) 32 buried in the epitaxial layer 31, an n-type well layer (first semiconductor layer) 12, a p-type well region (second semiconductor layer) 15 formed in the surface of the n-type well layer 12, and the n-type impurity region 17b formed in the surface of the p-type well region 15. The n-type buried layer 32 has relatively high impurity density. The n-type well layer 12 having relatively low impurity density is provided on the n-type buried layer 32 such that the n-type well layer 12 and the n-type buried layer 32 are connected. The n-type impurity layer 17 is covered with a thin insulation film 18.

The n-type impurity layer 17b, the p-type well layer 15, the n-type well layer 12 and the n-type buried layer 32 constitutes an npn type buried structure. Such buried structure as the photo-diode 10a can prevent influence of the semiconductor surface having many trap levels, and thus it is possible to decrease noise level. The n-type buried layer 32 and the n-type well layer 12 forms a thick n-type layer. Moreover, the n-type buried layer 32 in a deep region from the semiconductor surface serves as a deep depletion layer that can excite charges in response to long-wavelength incident light. Thereby, it is possible to increase sensitivity to red light.

The drain region 17a in the MOS transistor 10b is formed on the p-type well layer 15 so as to surround the outer edge of the ring-shaped gate electrode 19. The drain region 17a and the n-type impurity layer 17b are integrated. The source region 16a provided in the surface of the p-type well layer 15 is surrounded with the inner side of the gate electrode 19. An n$^+$-type contact layer 16b formed in the surface of the source region 16a decreases the resistance between the source region 16a and the tungsten plug 20.

The gate electrode 19 is formed on the p-type well layer 15 via the insulation film 18. A channel region is formed in the surface region of the p-type well layer 15 below the gate electrode 19. The channel region is sandwiched between the drain region 17a and source region 16a. A channel dope layer 15c is formed by implanting n-type impurities with appropriate density so that the channel region is kept at a depletion state at a voltage to normally operate the MOS transistor 10b. Thus, the MOS transistor 10b works as a depletion type n-channel MOS transistor.

The hole pocket 25 in the p-type well layer 15 below the channel dope layer 15c is self-aligned with respect to the gate electrode 19. The hole pocket 25 is formed over the whole ring-shaped region covered by the gate electrode 19, and the hole pocket 25 is the highest impurity density region in the p-type well layer 15.

Below the p-type well layer 15 in the MOS transistor 10b, a p-type buried layer (second buried layer) 33 having relatively high impurity density is formed via the n-type well layer 12. The p-type buried layer 33 and the n-type buried layer in the photo-diode 10a are connected. Thus, in the MOS transistor region 10b, the n-type well layer 12 provided between p-type layers becomes thin. The impurity profile in the p-type buried layer 33 and the n-type well layer 12 is designed such that the depletion layer extends in the p-type well layer 15, not in the p-type buried layer 33 in eliminating the photo-generated holes in the hole pocket 25 to the substrate 11 through the p-type buried layer 33. The depletion layer extended in the p-type buried layer 33 is thin. Since the electric field is concentrated in the p-well region 15 in ejecting photo-generated holes to the substrate 11, rapid change in the potential is generated in the p-type well region 15 with low reset voltage. Therefore, it is possible to ensure to eliminate the photo-generated holes accumulated in the hole pocket 25.

The n$^+$-type impurity region 17c, formed outside of the photo-diode 10a and the MOS transistor lob, surrounds the p-type well layer 15. The n$^+$-type impurity region 17c is connected to the tungsten plug 22 with low resistance. The drain region 17a and the n-type impurity layer 17b are connected to the n-type (same conductive type) well layer 12 via the n$^+$-type impurity region 17c, so the p-type well layer 15 is isolated by these n-type conductive regions in the unit pixel 10. A p$^+$-type region 14, formed outside of the n$^+$-type impurity region 17c, extends vertically from the surface of the n$^+$-type impurity region 17c to the substrate 11. The gate electrode 13 is provided above the p$^+$-type region 14 via the insulation film 18.

Each pixel 10 is covered by a metal layer (light-shielding film) 23 in light-tight manner, except the region in which a light-illumination window 24 is formed above the photo-diode 10a.

Referring to FIG. 2B, the potential profile in the unit pixel 10 shows that the hole-electron pairs are generated in the photo-diode 10a upon light irradiation, and that the photo-generated holes are transferred to the hole pocket 25 in the MOS transistor 10b. Then, electrons are induced in the channel region to cause accumulation of electrons. The potential to the hole in the hole pocket 25 decreases. The threshold voltage of the MOS transistor 10b is modulated in accordance with the amount of holes in the hole pocket 25. The optical signal (image signal) can be obtained by detecting the potential in the source region 16a that changes according to the threshold voltage.

Referring to FIG. 3, the above described unit pixels 10 are two-dimensionally arranged in columns (first direction) and rows (second direction). The unit pixels 10 arranged in column direction are isolated by an isolation region that comprises the gate electrode 13 biased at a low voltage and the highly doped p$^+$-type region 14 below the gate electrode 13. The unit pixels 10 arranged in the row direction are coupled to one another via the n$^+$-type impurity region 17c that extends in the row direction. The n$^+$-type impurity regions 17c provided for each rows are electrically isolated.

The plugs 20 coupled to the source regions 16a are connected to one another via plural vertical output line 34. One vertical output line 34 connects the plugs 20 of one column. The plugs 21 coupled to the gate electrodes 19 are connected to one another via plural vertical scan signal transfer lines 35. One vertical scan signal transfer line 35 connects the plugs 21 of one row. The vertical output line 34 and the vertical scan signal transfer line 35 are different metal layers. The plugs 22 connected to the n⁺-type impurity regions 17c are coupled via drain voltage supply lines that extend in the column direction or the row direction.

Figure 4:
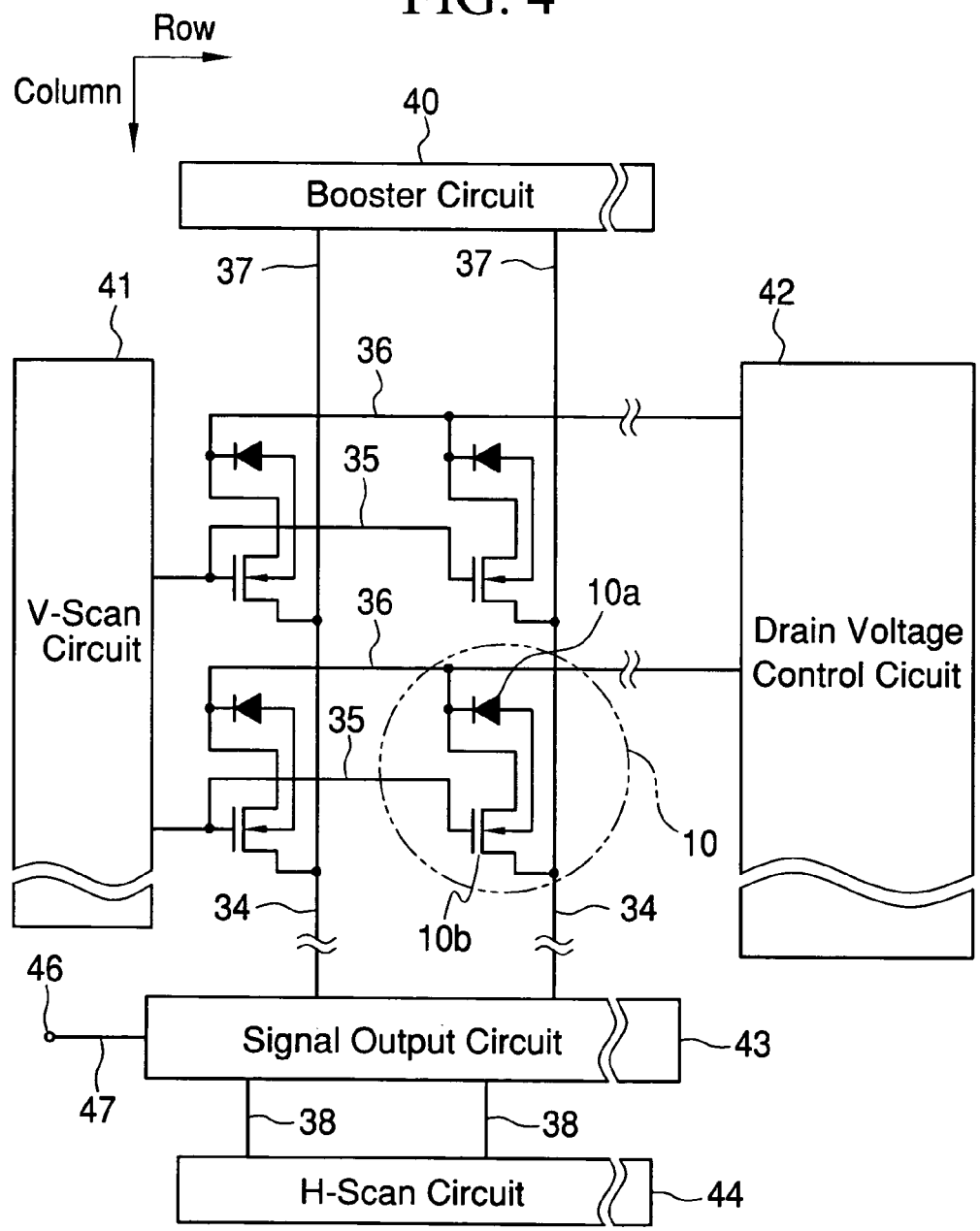
FIG. 4 is a circuit diagram of the solid-state imaging device.

Referring to FIG. 4, the MOS type solid-state imaging device has plural circuits, such as a booster circuit (first voltage supply circuit) 40, a vertical scan (V-scan) circuit (second voltage supply circuit) 41, a drain voltage control circuit (third voltage supply circuit) 42, a signal output circuit 43 to output optical signals, and horizontal scan (H-scan) circuit 44 to horizontally scan the signal output circuit 43. The booster circuit 40 supplies boosted voltage to the vertical output lines (first lines) 34. The V-scan circuit 41 scans and supplies voltage to the vertical scan signal transfer lines (second lines) 35. The drain voltage control circuit 42 supplies voltages to the drain voltage supply lines (third lines) 36. In the example shown in FIG. 4, the imaging device comprises a 2×2 matrix for the purpose of simplicity.

The booster circuit 40 is coupled to the boosted voltage output lines 37, each of which is connected to each of the vertical output lines 34. The vertical output lines 34 are coupled to the signal output circuit 43. The vertical scan signal supply lines 35 are connected to the V-scan circuit 41 to supply gate voltage to the gate electrode of each unit pixel 10. The drain voltage supply lines 36 are connected to the drain voltage control circuit 42 for supplying common drain voltage to the drain region 17a of each unit pixel 10. The H-scan circuit 44 and the signal output circuit 43 are connected via the horizontal scan signal supply lines 38 provided for each column.

Figure 5:
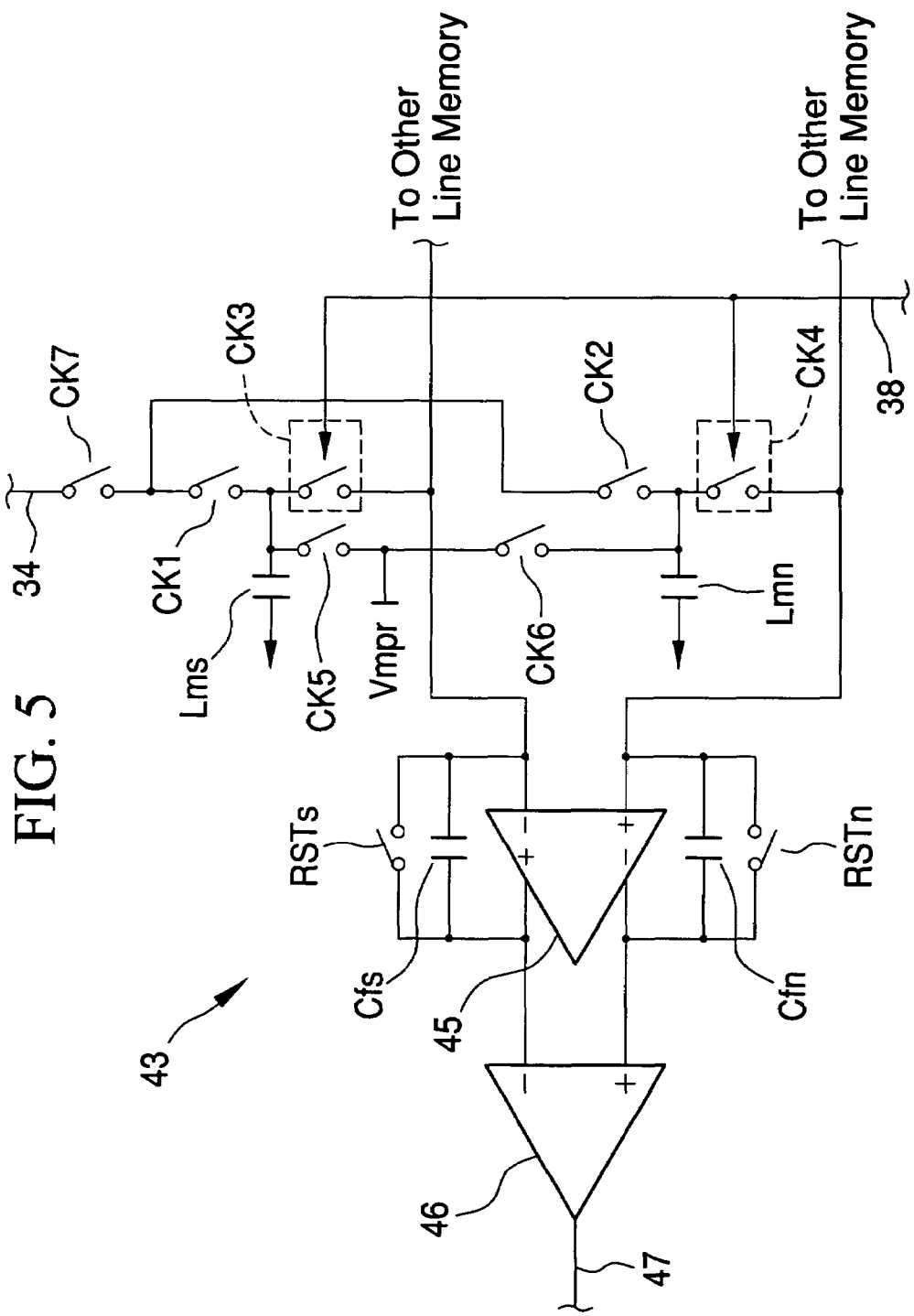
FIG. 5 is a circuit diagram of an image signal output circuit.

Referring to the signal output circuit 43 shown in FIG. 5, the vertical output line 34, connected to the source region 16a of the MOS transistor 10b, is coupled to a seventh switch circuit CK7 for protection against high voltage. Then, the vertical output line 34 is branched off and leads to the first switch circuit CK1 for connecting one terminal of the first line memory Lms, and the second switch circuit CK2 for connecting one terminal of the second line memory Lmn. The first line memory Lms stores the potential information corresponding to the source region 16a (VoutS). The potential information VoutS includes the potential modulated by the holes accumulated in the hole pocket 25, and the standard potential original to the unit pixel 10 before hole accumulation. The second line memory Lmn stores the potential information of the source region 16a (VoutN) that consists of the above standard potential after eliminating the photo-generated holed out of the hole pocket 25.

The first line memory Lms is coupled to the negative input terminal of an amplifier 45 of two-input and two-output type via the third switch circuit CK3. The operation (close/open) of the third switch circuit CK3 is controlled by the signal from the horizontal scan signal supply line 38. Also, the second line memory Lmn is coupled to the positive input terminal of an amplifier 45 via the fourth switch circuit CK4. The operation (close/open) of the fourth switch circuit CK3 is controlled by the signal from the horizontal scan signal supply line 38. The positive output terminal of the amplifier 45 is connected to the negative input terminal of a two-input and single-output type amplifier 46. The output terminal of the amplifier 46 is connected to the output terminal 48 via the horizontal output line 47.

A first feedback capacitor Cfs and a first reset switch circuit RSTs are provided in parallel between the negative input terminal and the positive input terminal of the amplifier 45. Between the positive input terminal and the negative output terminal of the amplifier 45, a second feedback capacitor Cfn and a second reset switch circuit RSTn are provided in parallel. The amplifier 45 can charge the feedback capacitors Cfs, Cfn with voltages corresponding to the input voltage thereto. The reset switch circuits RSTs, RSTn are closed to discharge the charges from the feedback capacitors Cfs, Cfn. The output voltage of the amplifier 46 corresponds to the difference in input voltages to the amplifier 45.

A circuit (not shown) to supply pre-set voltage Vmpr to the first and second line memories Lms, Lmn is connected to the terminal of the line memories Lms, Lmn via the fifth and sixth switch circuits CK5, CK6, individually. The pre-set voltage Vmpr is higher than the ground voltage, and lower than the source potential to be supplied. Since the pre-set voltage Vmpr is applied to the line memories Lms, Lmn before providing the potentials VoutS, VoutN, it is possible to prevent the MOS transistor 10b from operating even when the gate electrode is earthed. Therefore, it is possible to decrease current leakage in the MOS transistor 10b.

The first to seventh switch circuits CK1 to CK7, and the reset switch circuits RSTs and RSTn in the signal output circuit 43 are respectively comprised of n-channel MOS transistor and/or p-channel MOS transistor. The switch circuits CK1 and CK2, provided on the lines to transfer the source potential to the line memories Lms and Lmn, have so-called transmission gate in which the n-channel MOS transistor and the p-channel MOS transistor are coupled in parallel, so that higher source potential can be transmitted without signal distortion. The n-channel MOS transistor in the transmission gate is preferably depletion type because of low threshold voltage. As for other switch circuits (CK3 to CK7), single n-channel MOS transistor may be used. If high voltage from the booster circuit 40 is supplied to the vertical output line 34, the transmission gate of the switch circuit CK1, CK2 may not work properly since the pn junction in the source/drain regions of one transistor of the transmission gate (CK1, CK2) is forwardly biased. Thus, the switch circuit CK7 is closed and open to prevent irregular operation of the switch circuit CK1, CK2 even when high voltage is supplied to the vertical output line 34.

The line memories Lms, Lmn, and the switch circuits CK1 to CK7 are provided for the unit pixels in each column. Accordingly, the image signals Vout(=VoutS−VoutN) for the unit pixels in each column is obtained by calculating the difference between the voltage information VoutS, VoutN that are stored in the line memories Lms, Lmn, respectively.

Figure 6:
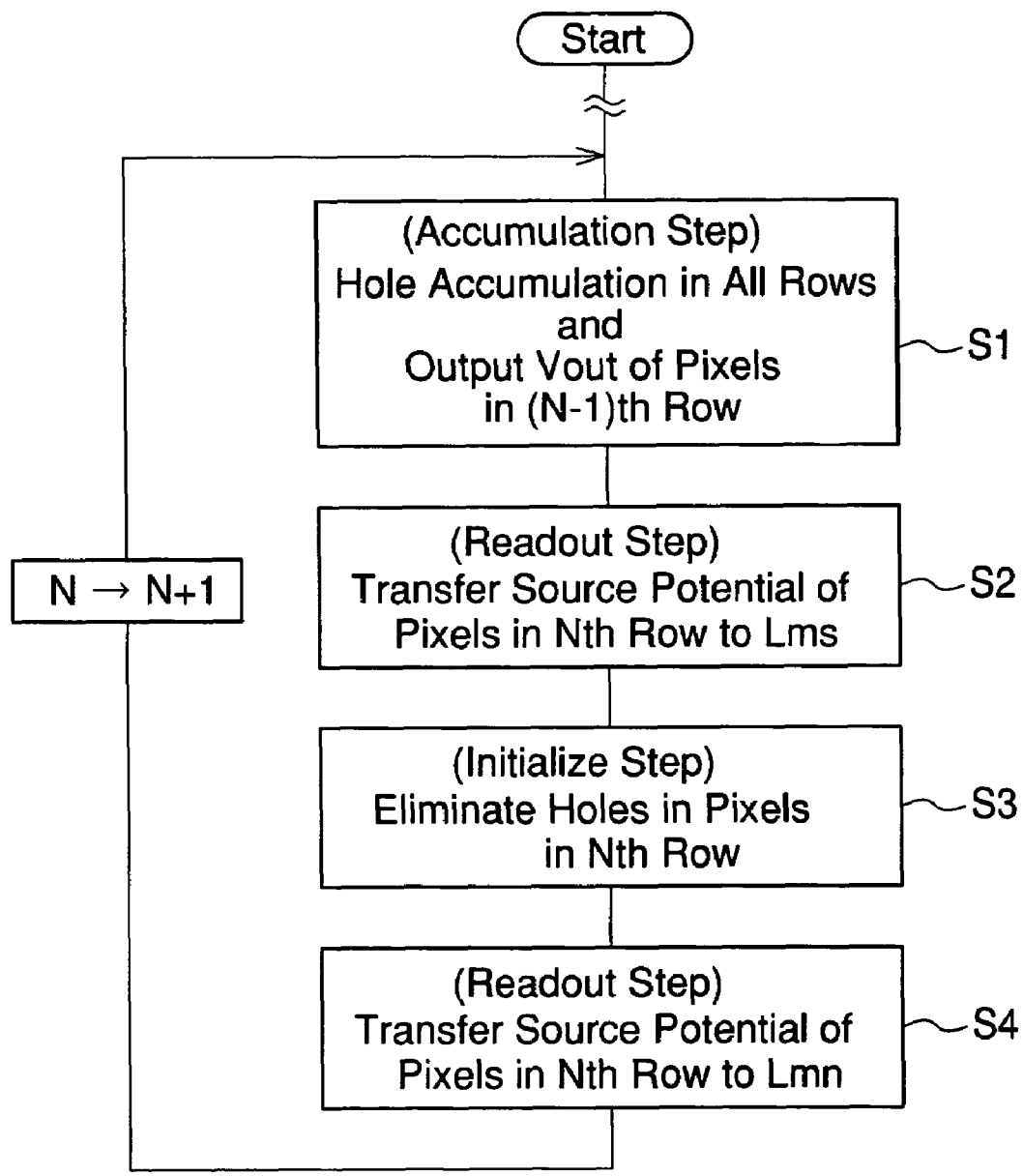
FIG. 6 is a flow chart of the image capture sequence of the solid-state imaging device.
Figure 7:
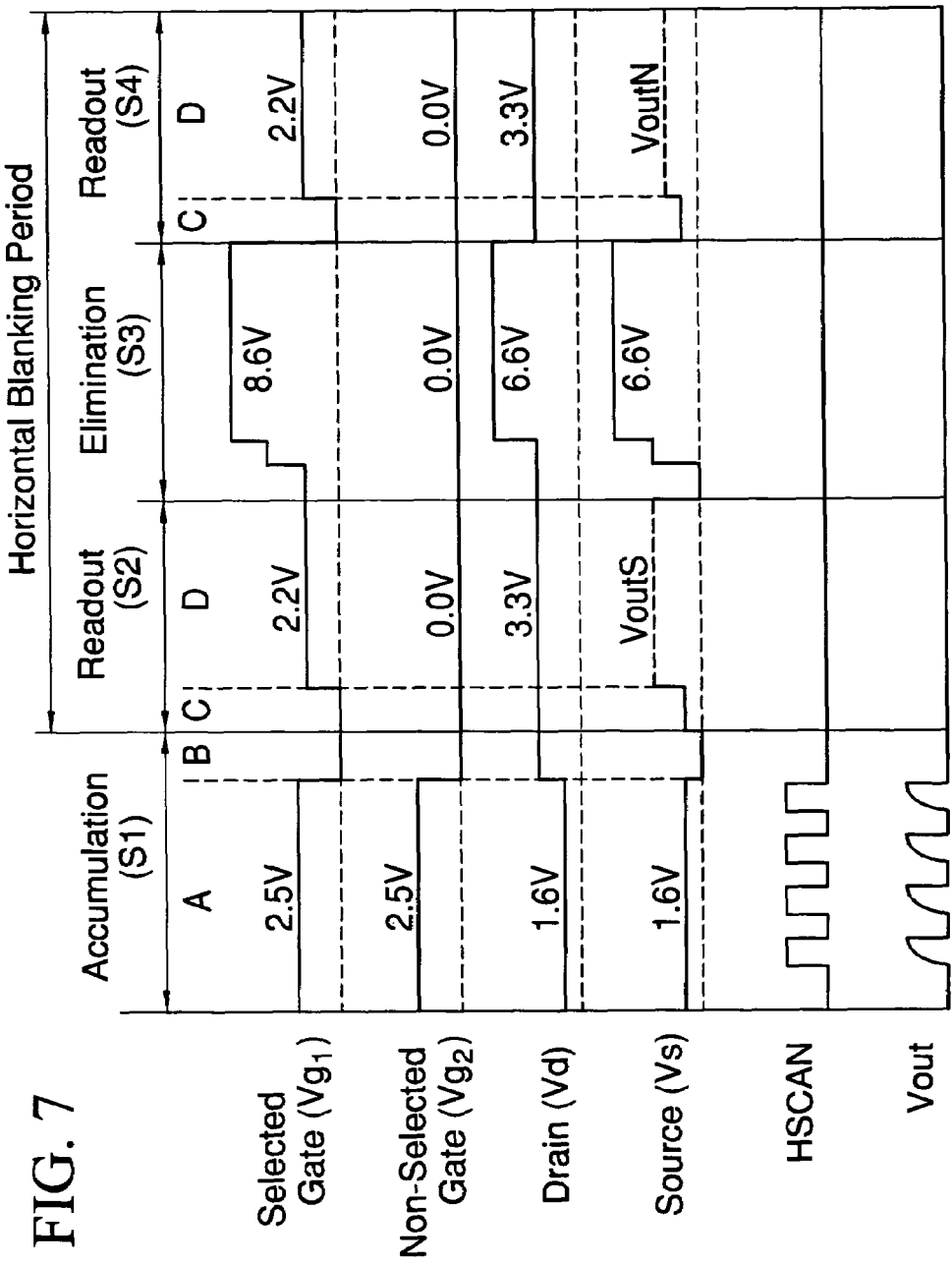
FIG. 7 is a timing chart of the applied voltages in the image capture sequence.

The operation of the MOS type solid-state imaging device will be described with reference to FIGS. 6 and 7. In response to initiating the imaging operation, the V-scan circuit 41 sequentially selects the row in which the unit pixels 10 are connected via the vertical scan signal supply line 35. The four steps S1–S4 (Accumulation (S1), Readout (S2), Initialize (S3) and Readout (S4)) are carried out for each selected row. When these steps are completed for the last row, the same steps are performed for the first row again to repeat the same sequence (so-called rolling).

In the accumulation step (S1), photo-generated holes region accumulated in the unit pixels 10 of all rows, and then the image signals Vout are output from the signal output circuit 43. During the period A in the accumulation step (S1), as shown in FIG. 7, the gate voltage (Vg1, Vg2) of about 2.5V is applied to the gate electrodes 19 of all unit pixels 10. The gate voltage Vg1 indicates the gate voltage to the unit pixels 10 in the row selected by the V-scan circuit 41. On the other hand, the gate voltage Vg2 indicates the gate voltage to the unit pixels 10 in the non-selected row. Note that the unit pixels 10 in the selected and non-selected rows carry out same operation during the accumulation step (S1).

In the unit pixel 10, the drain region 17a and the source region 16a and the p-type well layer 15 comprises the pn junction that are reversely biased. In order to prevent depletion in the channel region at the gate voltage of 2.5V and to accumulate the photo-generated electrons with sufficient density in the channel region, the drain voltage (Vd) of about 1.6V is applied to the drain regions 17a of all unit pixels 10. Moreover, in order not to conduct the current through the channel region, the source region 16a is separated from the external circuits by opening the switch circuit CK7. Thereby, the channel region can accumulate electrons of sufficient density (that is, electron pinning state is generated in the channel region). Since the source region 16a is connected the drain region 17a via the channel region, the potential of the source region 16a becomes the same as the potential of the drain region 17a (1.6V).

During the period A in the accumulation step S1, the p-type well layer 15 and the n-type well layer 12 are depleted, and the photo-generated holes generated in response to light illumination are accumulated in the p-type well layer 15. At that time, the potential to the holes in the $p^+$-type hole pocket 25 is the lowest in the p-type well layer 15, so the photo-generated holes in the p-type well layer 15 are transferred to the hole pocket 25 and accumulated therein.

Since there are sufficient amount of electrons accumulated in the channel region during the period A, the hole generation center at the surface level between the insulation film 18 and the channel region is kept in inactivate state. Thus, the holes at the surface level are kept from being discharged. That is, the leak current caused by hole at the surface level decreases. Since the amount of holes other than photo-generated holes accumulated in the hole pocket 25 decreases, it is possible to decrease noise (so-called white flaw) in an obtained image.

In the period B of the accumulation step (S1), the gate voltages Vg1, Vg2 are set 0.0V, and the drain voltage Vd is about 3.3V in order that the pn junction, comprised of the drain region 17a and the source region 16a and the p-type well layer 15, is deeply inversely biased. Thereby, the channel region is kept at depletion state, and the stronger electric field toward the hole pocket 25 in the p-type well layer 15 transfers remaining holes in the p-type well layer 15 to the hole pocket 25. Since the amount of the negative acceptors are varied in accordance with the hole amount in the hole pocket 25, so the potential near the source region 16a is modulated. Thus, the threshold voltage of the MOS transistor 10b is changed based on the amount of the photo-generated holes in the hole pocket 25.

During the accumulation step (S1), the image signals Vout as the difference in source potentials are output from the signal output circuit 43. The operation to output the image signals Vout will be explained in detail after the description of the step S4.

After the accumulation step S1, the readout step S2 is started. In the period C of the readout step S2, the switch circuits CK1, CK7 of the signal output circuit 43 is closed, and the switch circuit CK2 is open. Thereby, the line between the vertical output line 34 and the line memory Lms are connected, whereas the vertical output line 34 and the line memory Lmn are disconnected. The gate voltages Vg1, Vg2 are set to be ground (0.0V). And the pre-set voltage Vmpr of about 1.6V is applied to the line memory Lms by turning on the switch circuit CK5. At the time, the drain voltage Vd of all unit pixels 10 is kept to be about 3.3V. The pre-set voltage Vmpr is higher than the ground voltage, and is lower than the source potential VoutS, VoutN to be stored in the line memories Lms, Lms during the period D in the readout steps S2, S4.

During the period D of the readout step S2, the switch circuits CK2, CK5 are open and the switch circuits CK1, CK7 are closed, so that the line memory Lms and the vertical output line 34 are connected. The V-scan circuit 41 applies the gate voltage Vg1 of about 2.2V to the vertical scan signal supply line 35 of the selected row (Nth row, for instance). The gate voltage Vg2 to the non-selected rows is the same as ground voltage (0.0V). The drain voltage Vd of all unit pixels 10 is kept to be about 3.3V. Thus, the MOS transistor 10b of the selected unit pixels 10 is saturated.

During the period D, the voltage in the line memory Lms becomes the same as the source potential VoutS of the selected unit pixels 10 (in Nth row). In short, the line memory Lms stores the information of the source potential VoutS. The source potential VoutS includes the potential modulated by the photo-generated holes in the carrier pocket 25 and the standard potential VoutN of the unit pixel 10. Note that the expression "Readout" indicates the process to transfer the source potential information to the line memory Lms.

After the readout step S2 is completed, the initialization step S3 is started, and the switch circuit CK7 for blocking high voltage and the switch circuits CK1, CKT5 are open. The unit pixels 10 in the selected Nth row becomes floating state (high impedance state) by electrically separating the gate electrode 19 and the drain region 17a from external circuits. At that time, the gate electrode 19 of non-selected unit pixels 10 is grounded (that is, the gate voltage Vg2 is 0.0V). The booster circuit 40 supplies a high voltage of about 6.6V to the source region 16a, so the drain voltage Vd becomes about 6.6V. Since the potential of the gate electrode 19 of the selected Nth row is already about 2.2V, so the gate voltage Vg1 becomes about 8.6V by application of about 6.6V.

The gate voltage Vg1 is applied to the p-type well layer 15 and the n-type well layer 12 therebelow, so that high electric field is generated. Such high electric field can eliminate the photo-generated holes out of the hole pocket 25 and the p-type well layer 15 in the selected (in Nth row) unit pixels 10. In this way, it is possible to initialize the unit pixel 10 with a low voltage. As for the unit pixels 10 in the non-selected row, the photo-generated holes are kept in the hole pocket 25. At that time, the switch circuit CK7 for high voltage blocking is off, so the switch circuits CK1, CK2 and the source region 16a are not electrically connected. Thus, a high voltage is not applied to the source/drain regions of the p-channel MOS of the transmission gate that comprises the switch circuit CK1, CK2.

After the elimination step S3 is completed, the readout step S4 begins. The readout step S4 is similar to the readout step S2, except that the switch circuits CK2, CK6 are closed instead of the switch circuits CK1, CK5. In the readout step S4, the standard voltage VoutN, original to the unit pixel 10 after the photo-generated holes has been eliminated, is supplied to the line memory Lmn. The steps S2–S4 are carried out during the horizontal blanking period in which the readout and initialization steps for one row are carried out.

When the readout step S4 is completed, the switch circuits Ck2, CK6 are open, and the accumulation step S1 for the next row begins. While the accumulation step S1 is carried out, the difference in the source voltages VoutS, VoutN stored in the line memories Lms, Lmn is calculated to output the image signal Vout.

In outputting the image signal, the H-scan circuit 44 supplies horizontal scan signal (HSCAN) sequentially to the horizontal scan signal supply lines 38 for each row. The switch circuits CK3, CK4, corresponding to the horizontal scan signal supply line 38 supplied with the horizontal scan signal (HSCAN), are closed. Then, the source voltage VoutS, VoutN stored in the line memories Lms, Lmn are respectively input to the negative and positive input terminals of the amplifier 45. Since the reset switch circuits RSTs, RSTn are both open, the electrons in the line memories Lms, Lmn are transferred to the feedback capacitors Cfs, Cfn so that the output voltage of −VoutS, −VoutN are output from the positive and negative output terminals of the amplifier 45. The output voltages of −VoutS, −VoutN are respectively input to the negative and positive input terminals of the amplifier 46, and the voltage corresponding to the difference (VoutS−VoutN) is output from the output terminal of the amplifier 46.

The horizontal scan circuit 44 scans the unit pixels 10 in each row to carry out the above described operation row by row. Thereby, the image signals (VoutS−VoutN) corresponding to the illumination light amount is sequentially obtained through the horizontal output lines 47.

After the accumulation step S1 is completed, the next (N+1)th row is selected, and the steps S2–S4 are carried out for (N+1)th row. In this way, the image signals Vout for other rows are obtained. When the step S1 for the last row is completed, the first row is selected and the same operations are carried out. The exposure time (hole accumulation time) is the time from the end of the horizontal blanking period to the beginning of the horizontal blanking period of the next row. That is, the exposure time corresponds to the frame time.

Figure 8A:
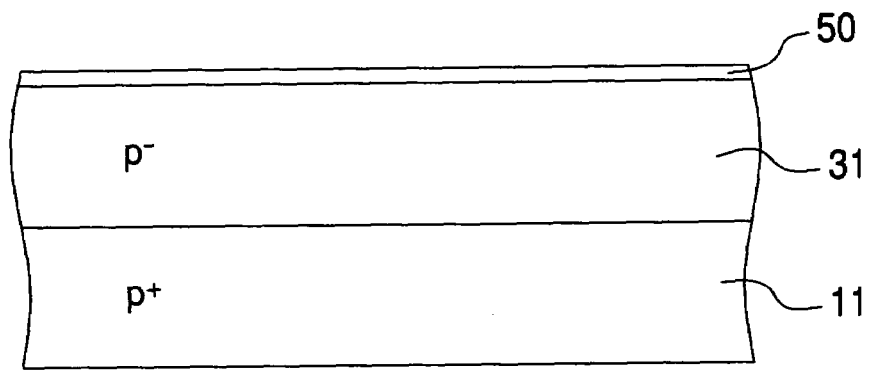
FIGS. 8A, 8B, 9A, 9B, 10A, 10B, 11A, 11B, 12A, 12B, 13A and 13B are cross sectional views showing the processes to manufacture the pixel.

Next, the processes to manufacture the unit pixel 10 will be described with reference to the drawings. Referring to FIG. 8A, p⁻-type silicon with the lower impurity than the p⁺-type substrate 11 having the impurity density of $1.0\times10^{18}$ cm$^{-3}$ or higher is epitaxially deposited on the substrate 11, so that the p⁻-type epitaxial layer 31 with the impurity density of about $1.0\times10^{15}$ cm$^{-3}$ is formed. Then, the insulation film 50 is generated by thermal oxidization of the surface of the p⁻-type epitaxial layer 31.

Figure 8B:
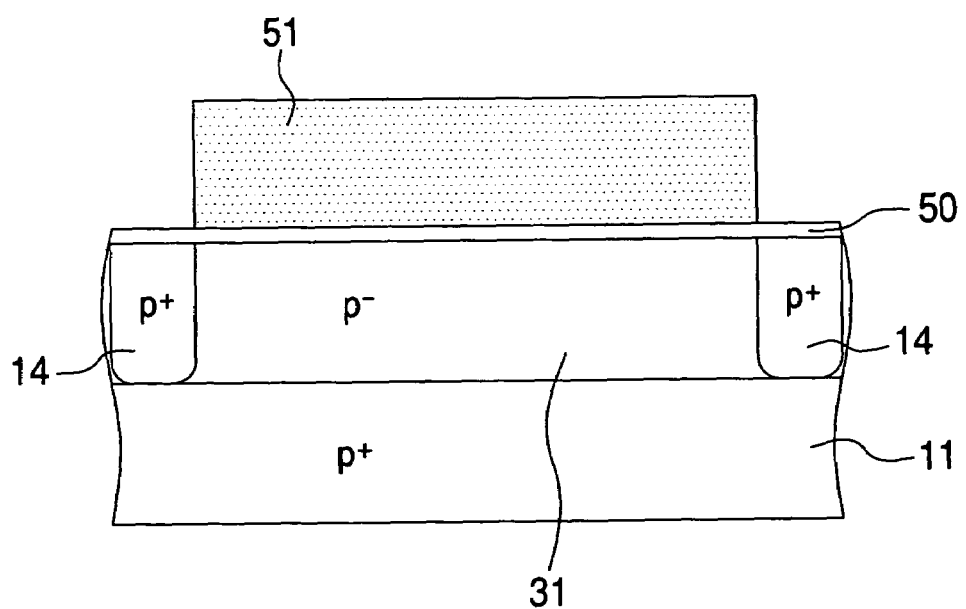

As shown in FIG. 8B, a resist mask 51 is formed on the insulation layer to cover the pixel isolation region. Then, through the openings formed in the resist mask 51, p-type impurity ions (Boron⁺ (B⁺)) are implanted by ion implantation process. Thereby, the p⁺-type impurity region 14 with similar impurity density as the substrate 11 is formed in the epitaxial layer 31 so as to extend from the surface of the epitaxial layer 31 to the substrate 11.

Figure 9A:
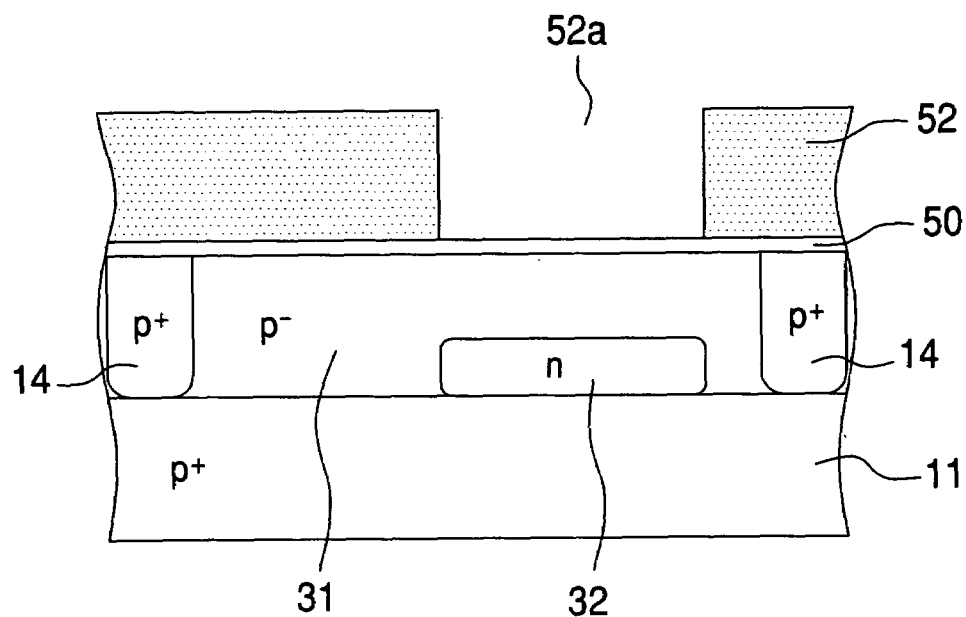

After removing the resist mask 51, a resist mask 52 with the opening 52a corresponding to the photo-diode 10a region is formed (see FIG. 9A), and then the n-type impurity ions ((Phosphorus⁺ (Ph⁺))) are deeply implanted through the opening 52a. Thereby, n-type buried layer 32 with the peak impurity density of about $1.0\times10^{17}$ cm$^{-3}$ is formed in a deep region of the p⁻-type epitaxial layer 15.

Figure 9B:
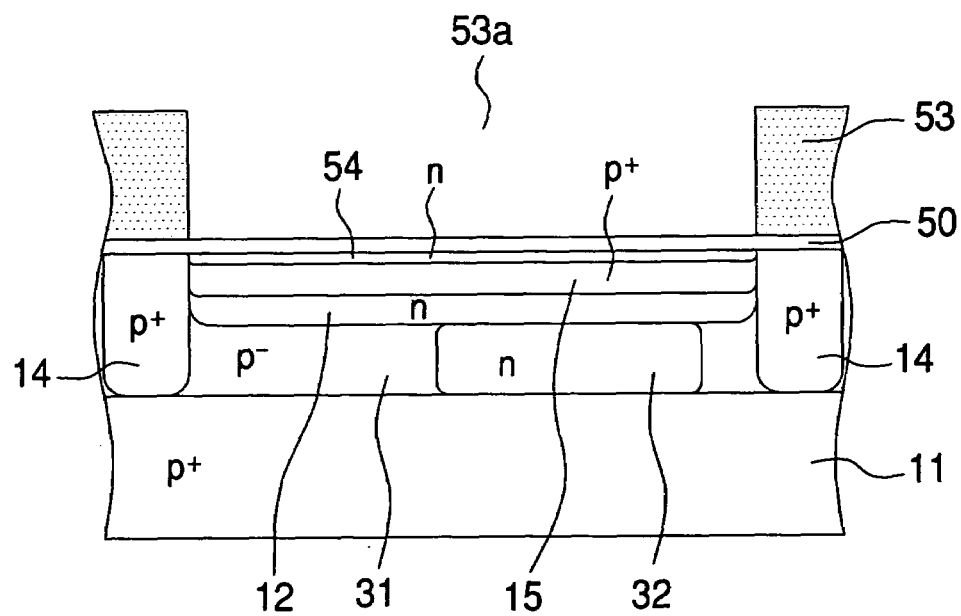

After the resist mask 52 is removed, a resist mask 53 is formed. An opening 53a formed in the resist mask 53 corresponds to the region other than the pixel isolation region, as shown in FIG. 9B. Then, n-type impurity ions (Ph⁺) are deeply implanted through the opening 53a, so that the n-type well layer 12 having the impurity density of about $3.0\times10^{16}$ cm$^{-3}$ is formed. The bottom edge of the n-type well layer 12 reaches the n-type buried layer 32. In addition, p-type impurity ions (B⁺) are implanted through the opening 53a to form the p⁺-type well layer 15 having the impurity density of about $6.0\times10^{16}$ cm$^{-3}$ in the surface of the n-type well layer 12. Moreover, n-type impurity ions (Arsenic⁺ (As⁺)) are shallowly implanted through the same opening 53a, so that the n-type dope layer 54 having the impurity density of about $2.0\times10^{17}$ cm$^{-3}$ is formed in the surface of the well layer 15.

Figure 10A:
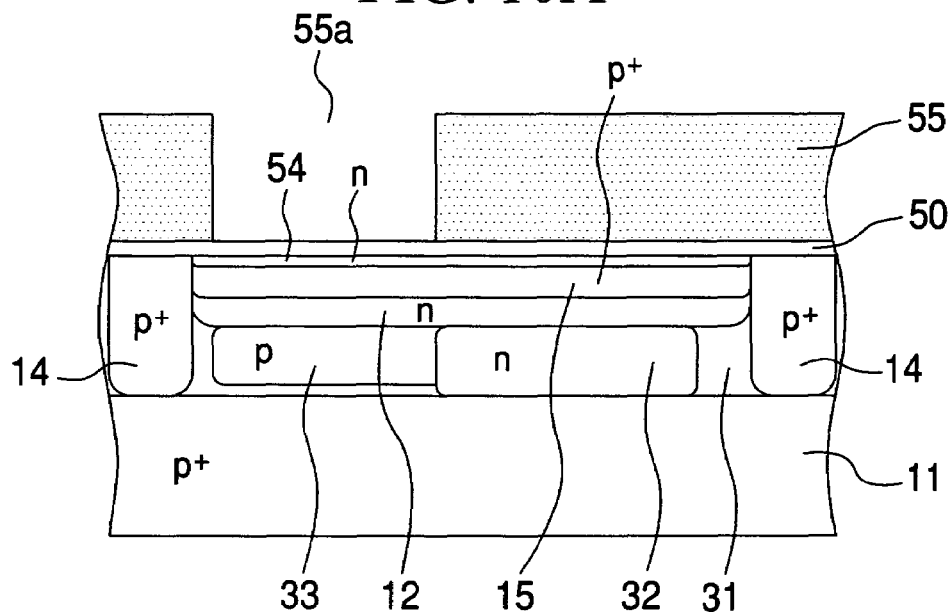

The resist mask 53 is removed. Then, as shown in FIG. 10A, a resist mask 55 with the opening 55a corresponding to the MOS transistor 10b is formed, and then the n-type impurity ions (B⁺) are deeply implanted through the opening 55a. Thereby, p-type buried layer 33 with the impurity density of about $5.0\times10^{16}$ cm$^{-3}$ is formed in a deep region from the surface of the MOS transistor 10b.

Figure 10B:
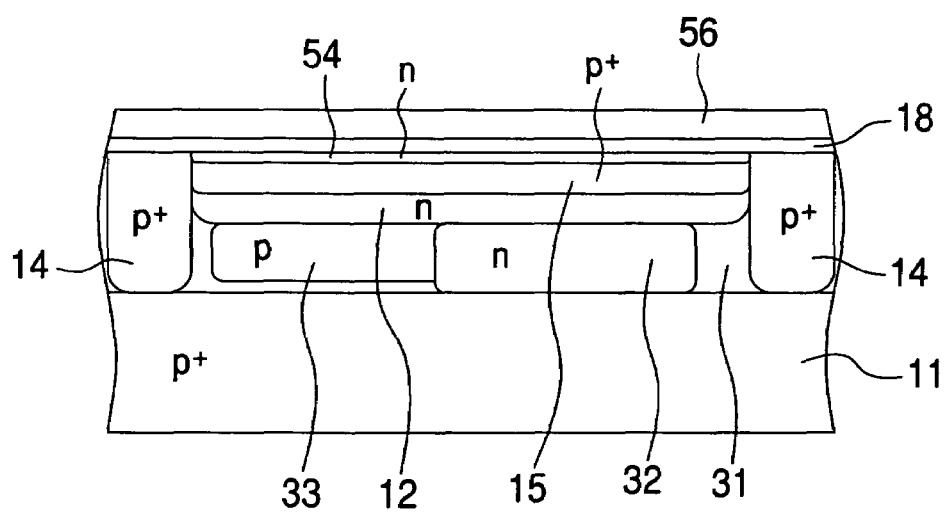

The resist mask 55 and the insulation film 50 are removed. Then, the surface of the unit pixel is subject to thermal oxidization to form the insulation film 18 (see FIG. 10B). The conductive film 56 is formed on the insulation film 18 by depositing poly silicon and tungsten silicide, for instance.

Figure 11A:
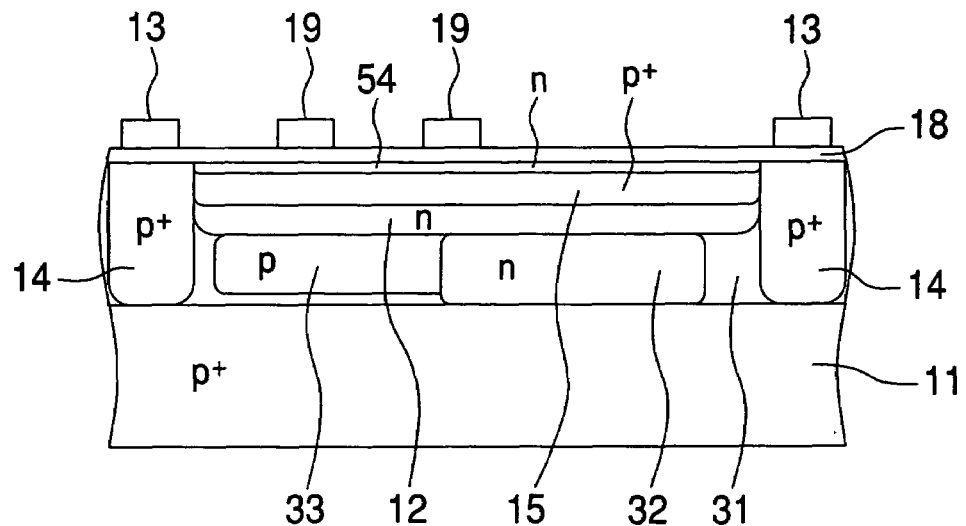

As shown in FIG. 11A, the conductive film 56 is subject to patterning process by etching to form the gate electrode 19 of the MOS transistor 10b and the gate electrode 13 for separating the unit pixels 10.

Figure 11B:
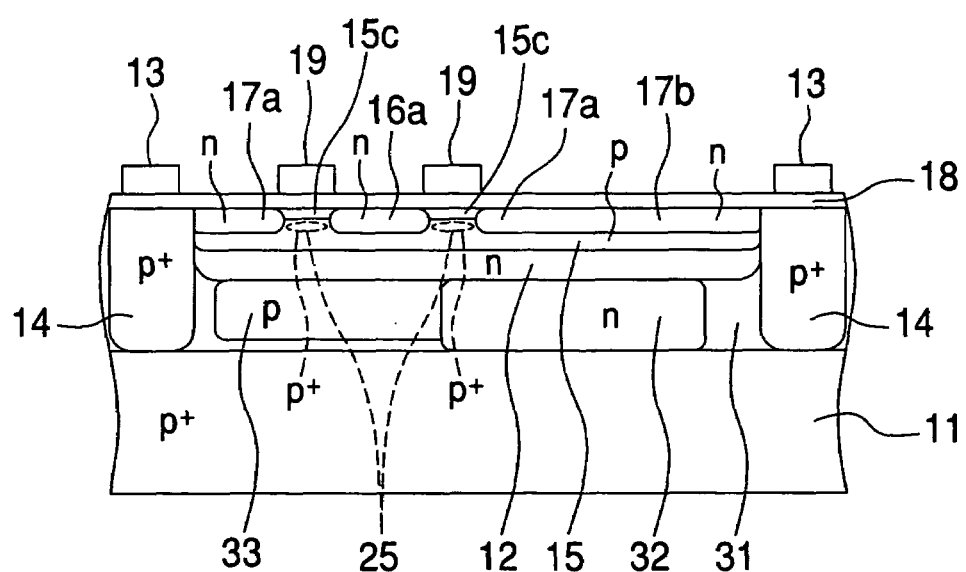

Referring to FIG. 11B, the source region 16a, the drain region 17 and the n-type impurity layer 17b with the impurity density of about $6.0\times10^{17}$ cm$^{-3}$ are formed in the surface of the p⁺-type well layer 15 by implanting the n-type impurity ions (As⁺) via the gate electrodes 19, 13 as masks. Such ion implantation changes the impurity distribution in the p⁺-type well region 15 such that the impurity density in the region other than the region below the gate electrode 19 decreases. After the ion implantation, the thin n-type dope layer 54 is localized in the region below the gate electrode 19, thereby the channel dope layer 15c is formed. The source region 16a and the drain region 17 are formed by self-alignment to the gate electrode 19, and a high impurity density region as the hole pocket 25 is formed by self-alignment to the gate electrode 19.

Figure 12A:
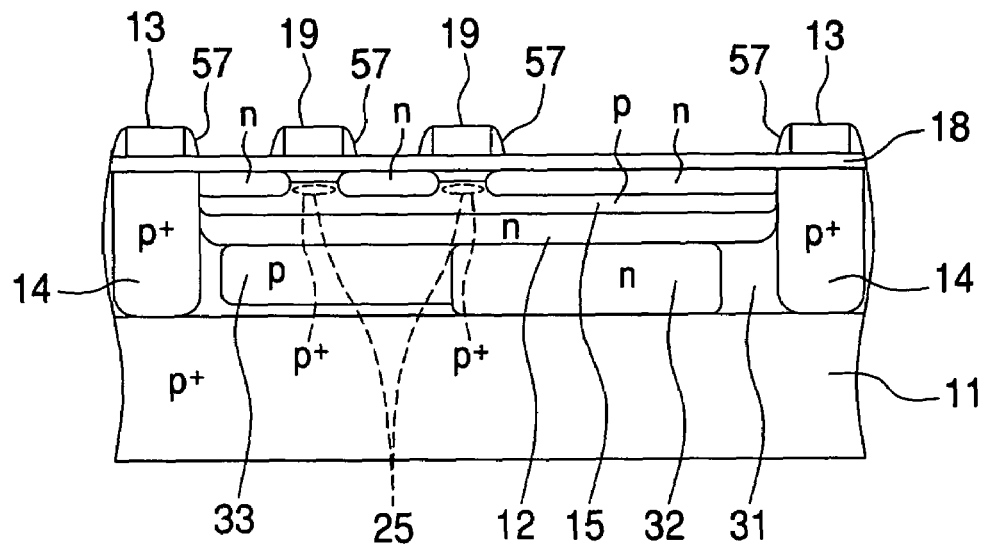

Referring to FIG. 12A, an insulation film is formed by chemical vapor deposition (CVD) process or the like, and then, side walls 57 are formed on the lateral sides of the gate electrode 13, 19 by anisotropic etching process.

Figure 12B:
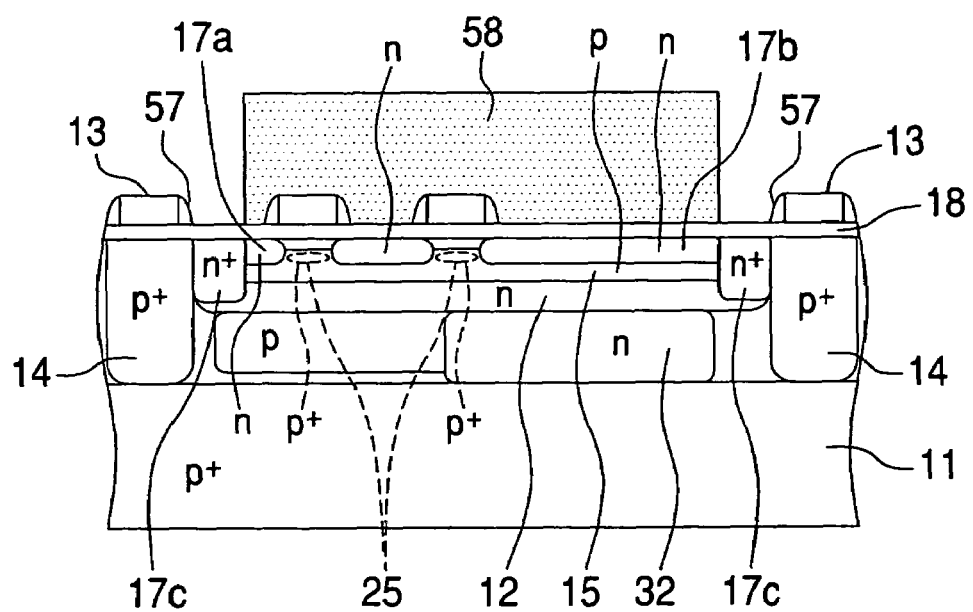

As shown in FIG. 12B, a resist mask 58 to cover the region corresponding to the photo-diode 10a and the MOS transistor 10b is formed. By implanting the n-type impurities ion (Ph⁺), the n⁺-type impurity layer 17c having the impurity density of about $2.0\times10^{18}$ cm$^{-3}$ is formed. The n⁺-type impurity layer 17c surrounds the p-type well layer 15 and connects the drain region 17a and the n-type impurity layer 17b to the n-type well layer 12, so the p-type well layer 15 is isolated by n-type regions.

Figure 13A:
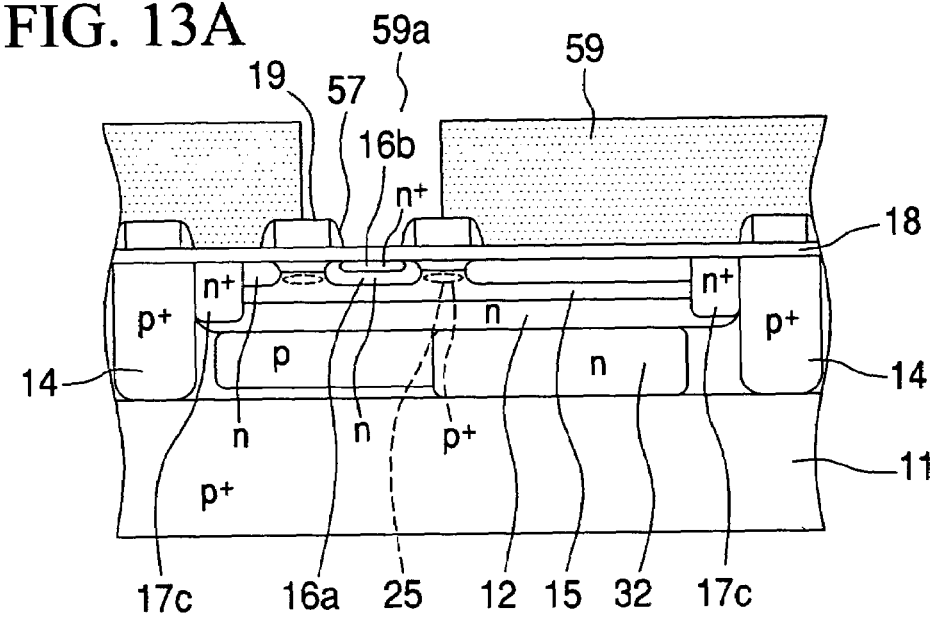

Referring to FIG. 13A, the resist mask 58 is removed, and then the resist mask 59 is formed. The source region 16a and the gate electrode 19 are partially exposed through an opening 59a formed in the resist mask 59. Also the side wall 57 is exposed through the opening 59a. The n-type impurity ions (As⁺) with high density are shallowly implanted. The resist mask 59, the gate electrode 19 and the side wall 57 serves as the mask in ion implantation. Thereby, the n⁺-type contact layer 16b is formed in the surface of the source region 16a.

Figure 13B:
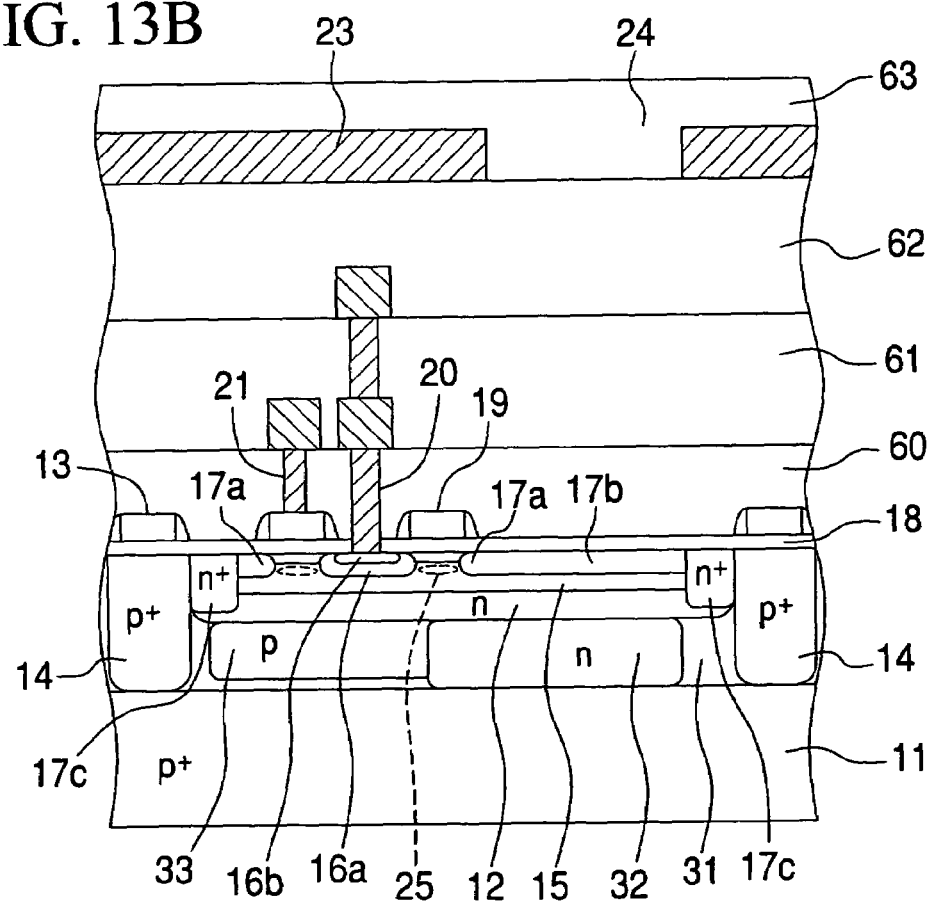

In FIG. 13B, the insulation layers 60–63 to cover the whole surface of the unit pixel 10 are sequentially deposited after removing the resist mask 59. A metal line layer, and tungsten plugs 20, 21 to connect the contact layer 16b and the gate electrode 13 to the metal line layer are formed. Although not illustrated in the drawing, the tungsten plug 22 to connect the n+-type impurity region 17c to the metal line layer is formed at the same time. On the insulation layer 62, the light-shielding film 23 with the light receiving window 24 to expose the photo-diode 10a is formed. In this way, the unit pixel 10 is manufactured. The light-shielding film 23 may serve as the line layer as well.

Figure 14:
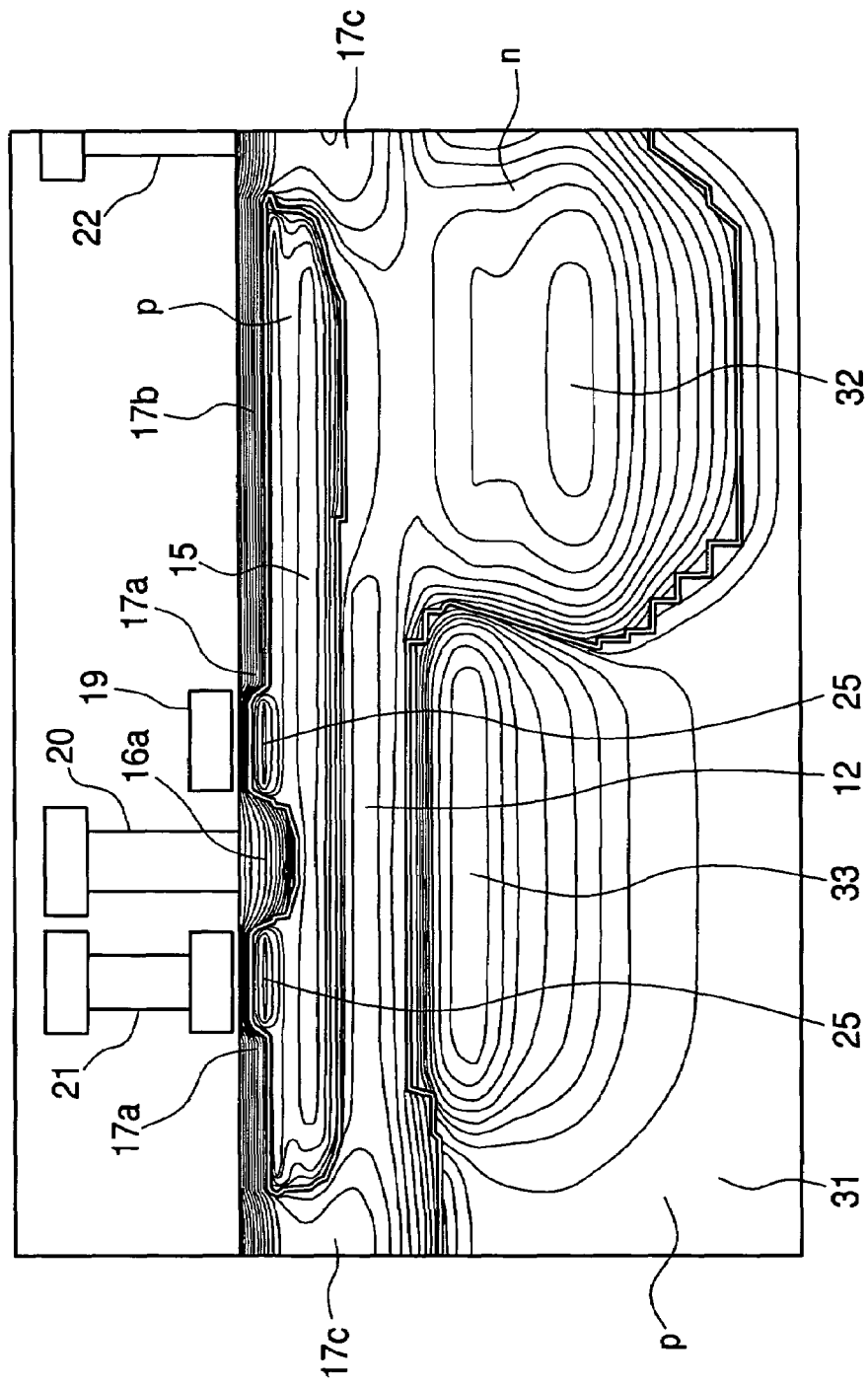
FIG. 14 is an impurity density profile in the unit pixel.

FIG. 14 is the impurity density profile obtained by device simulation by use of the calculation model of the unit pixel 10. This impurity density profile shows that the p-type high impurity density region is localized in the surface area of the p-type well layer below the gate electrode 19. This high impurity density region is the hole pocket 25.

Since the above described method to manufacture the unit pixel 10 can form the hole pocket 25 without implanting the ions to the region corresponding to the hole pocket 25, no resist mask is needed for such ion implantation. In other words, the hole pocket 25 is formed by self-alignment to the gate electrode 19, so the position of the hole pocket 25 to the gate electrode 19 is not deviated. In addition, the position of the hole pocket 25 is not deviated from the source and drain regions 16a, 17a that are self-aligned to the gate electrode 19. Thereby, it is possible to decrease variation in capacitance between the hole pocket 25 and the gate electrode 19, the source region 16a, and the drain region 17a. Moreover, self-alignment of the hole pocket 25 has the advantage in reducing the error range of deviation in the threshold voltage of the MOS transistor 10b.

In the above embodiment, the gate electrode 13 biased at a low voltage and the p+-type region 14 with high impurity density generates the isolation region to isolate the unit pixels 10 of adjacent rows so that the n+-type impurity regions 17c for adjacent rows are electrically isolated. The purpose of forming the isolation region is to decrease the load to the n+-type impurity region 17c connected to the drain region 17a at floating state when the drain voltage Vd is boosted with a high voltage to the source region 16a during the initialization period.

Figure 15:
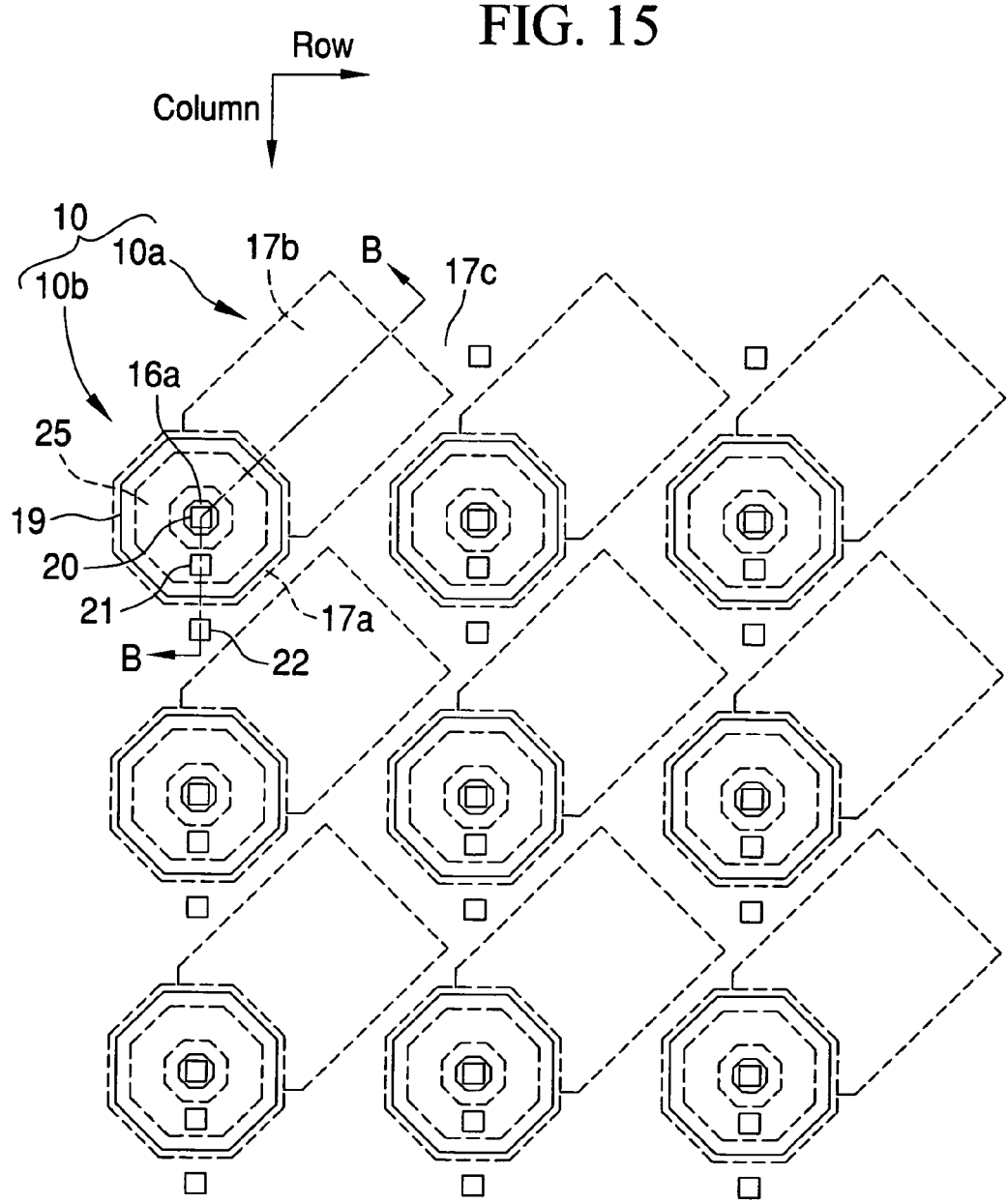
FIG. 15 is a plan view showing the layout of a unit pixel of a solid state imaging device according to second embodiment.
Figure 16:
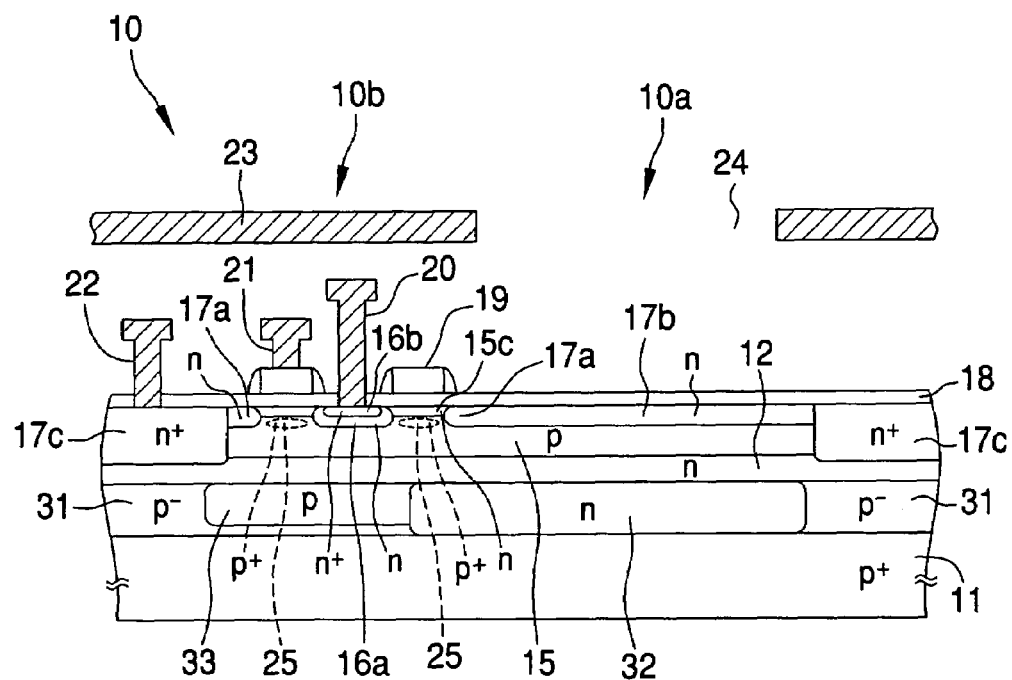
FIG. 16 is a cross section, taken along the line B—B of FIG. 15, to illustrate the structure of the unit pixel.

As shown in FIGS. 15, 16, however, the isolation region to separate the unit pixels 10 may not be provided. Instead, the n+-type impurity region 17c may be extended over all unit pixels 10 so as to make the n+-type impurity region 17c common between the unit pixels 10 of adjacent rows. Eliminating the isolation region can narrow the gap between the unit pixels 10 of adjacent rows, and thus accumulation of the unit pixels 10 in the column direction can be realized. Note that, in FIGS. 15, 16, same reference numerals are provided with the same layers and the regions as those in the above embodiment.

Although not illustrated in the drawings, the vertical output lines 34 and the vertical scan signal supply lines 35 respectively connects the plugs 20, 21 in the same manner as FIG. 3. In addition, the plugs 22 connected to the n+-type impurity regions 17c are coupled with one another via the drain voltage supply lines 36. The plug 22 is connected to an appropriated portion in the n+-type impurity region 17c.

Referring to FIG. 17, the n+-type impurity region 17c is extended over all unit pixels 10. A switch circuit 49 is provided to effectively boost the drain voltage Vd to be applied to the n+-type impurity region 17c. The switch circuit 49 is coupled to the drain voltage supply line 36 and the boosted voltage supply line 37 for each unit pixel 10, and connects (close) or disconnects (open) the drain voltage supply line 36 and the boosted voltage supply line 37. That is, the switch circuit 49 connects/disconnects the source region 16a and the drain region 17a for each unit pixel 10 to external circuits.

According to another embodiment of the MOS type solid-state imaging device, the gate electrodes 19 of the same row are electrically isolated from external circuits to make the unit pixels 10 at floating state during the initialization step S3 (see FIG. 7) to eliminate the photo-generated holes in the hole pocket 25 to the substrate 11. Then, the booster circuit 40 supplies a high voltage to the source region 16a via the boosted voltage output lines 37. The switch circuit 49 closes the line between the drain voltage supply line 36 and the boosted voltage output line 37 to externally connect the source region 16a to the drain region 17a. Thereby, since a high voltage is commonly applied to the source region 16a and the drain region 17a, the source-gate capacitance can increase the voltage of the gate electrode 19. In this way, the switch circuit 49 makes it possible not to boost the high-loaded n+-type impurity region 17c via the channel region, it is possible to effectively provide a high electric field in the unit pixel 10.

In the accumulation step S1 (see FIG. 7), the drain voltage Vd and the source voltage Vs are the same (about 1.6V), so the switch circuit 49 may connect the drain voltage supply line 36 and the boosted voltage output line 37 so that the source region 16a and the drain region 17a are electrically connected. In the readout step (S2, S4), the switch circuit 49 opens drain voltage supply line 36 and the boosted voltage output line 37.

The method for manufacturing the unit pixels 10 in which the n+-type impurity region 17c is extended over all unit pixels 10 will be described with reference to the drawings. Note that the same reference numbers are provided with the same parts in the previous embodiment.

Figure 18A:
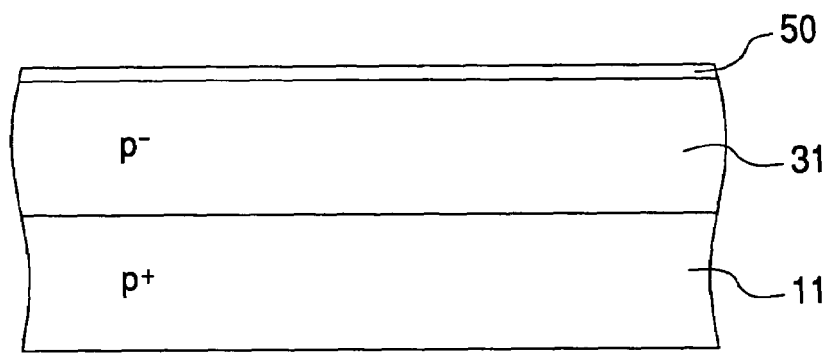
FIGS. 18A, 18B, 19A, 19B, 20A, 20B, 21A, 21B, 22A, 22B and 23 are cross sectional views showing the processes to manufacture the pixel according to second embodiment.

Referring to FIG. 18A, p−-type silicon with the lower impurity than the p+-type substrate 11 having the impurity density of $1.0 \times 10^{18}$ cm$^{-3}$ or higher is epitaxially deposited on the substrate 11, so that the p−-type epitaxial layer 31 with the impurity density of about $1.0 \times 10^{15}$ cm$^{-3}$ is formed. Then, a pad insulation layer 50 is generated by thermal oxidization of the surface of the p−-type epitaxial layer 31.

Figure 18B:
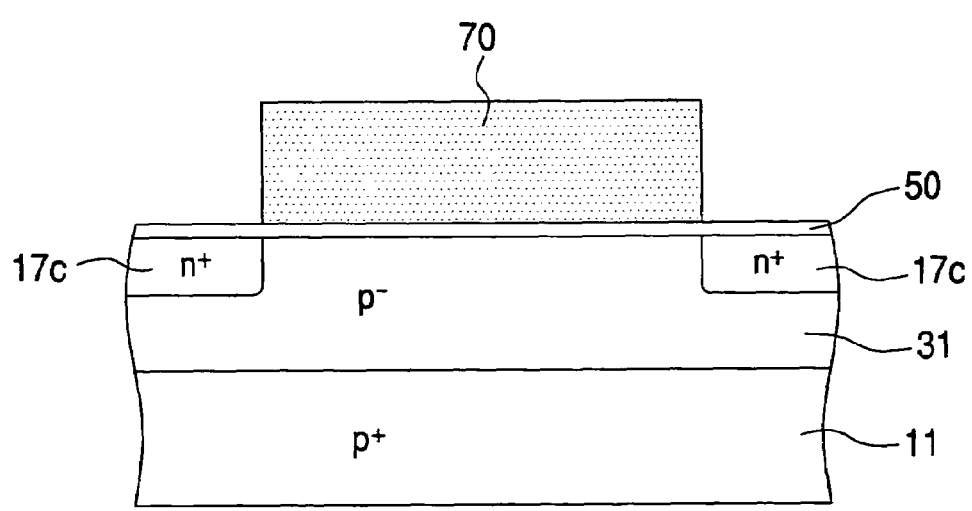

As shown in FIG. 18B, a resist mask 70 is formed on the insulation layer to cover the region corresponding to the photo-diode 10a and the MOS transistor 10b. Then, through the openings formed in the resist mask 70, p-type impurity ions (Ph+) are implanted. Thereby, the n+-type impurity region 17 with the impurity density of about $2.0 \times 10^{18}$ cm$^{-3}$ is formed in the surface of the epitaxial layer 31.

Figure 19A:
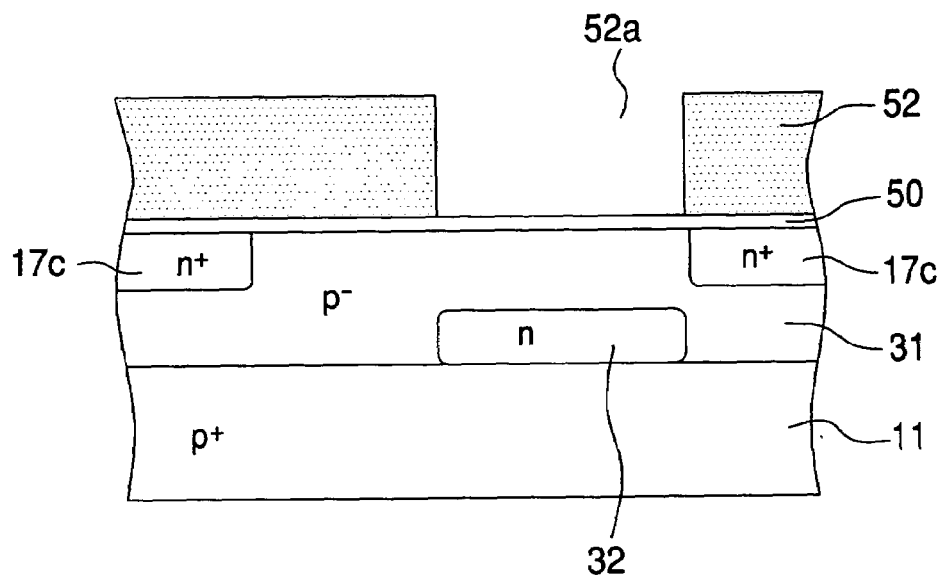

After removing the resist mask 70, a resist mask 52 with the opening 52a corresponding to the photo-diode 10a region is formed (see FIG. 19A), and then the n-type impurity ions (Ph+) are deeply implanted through the opening 52a. Thereby, n-type buried layer 32 with the impurity density of about $1.0 \times 10^{17}$ cm$^{-3}$ is formed in a deep region of the p−-type epitaxial layer 31.

After the resist mask 52 is removed, n-type impurity ions (Ph+) are implanted over the whole surface so that the n-type well layer 12 having the impurity density of about $3.0 \times 10^{16}$ cm$^{-3}$ is formed. The bottom edge of the n-type well layer 12 reaches the n-type buried layer 32. In addition, p-type impurity ions (B+) are implanted over the whole surface to form the p+-type well layer 15 having the impurity density of about $6.0 \times 10^{16}$ cm$^{-3}$ in the surface of the n-type well layer 12. Moreover, n-type impurity ions (As+) are shallowly implanted over the whole surface, so that the n-type dope layer 54 having the impurity density of about 2.0×10$^{17}$ cm$^3$ is formed in the surface of the well layer 15.

Thereafter, the same processes as described in the previous embodiment (see FIGS. 10A to 13B) except that the gate electrode 13 for pixel isolation is not formed, so the detailed explanations of FIGS. 20A to 23B are omitted.

Figure 19B:
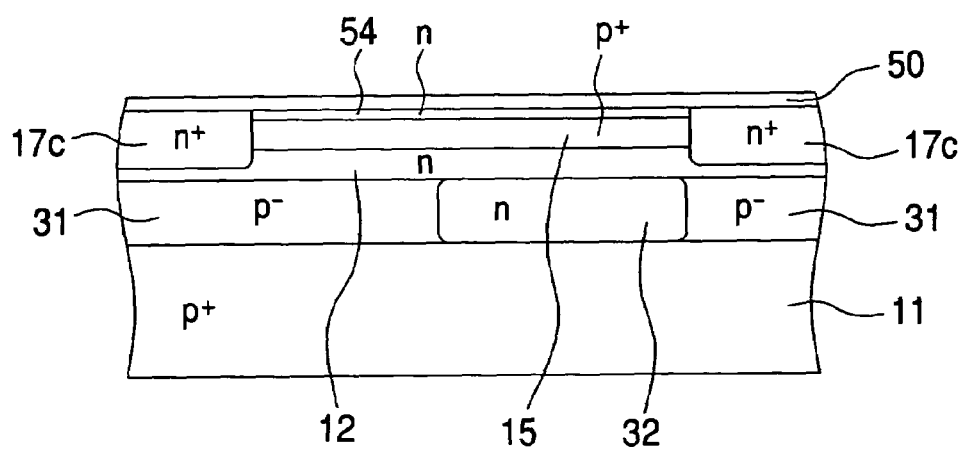
Figure 20A:
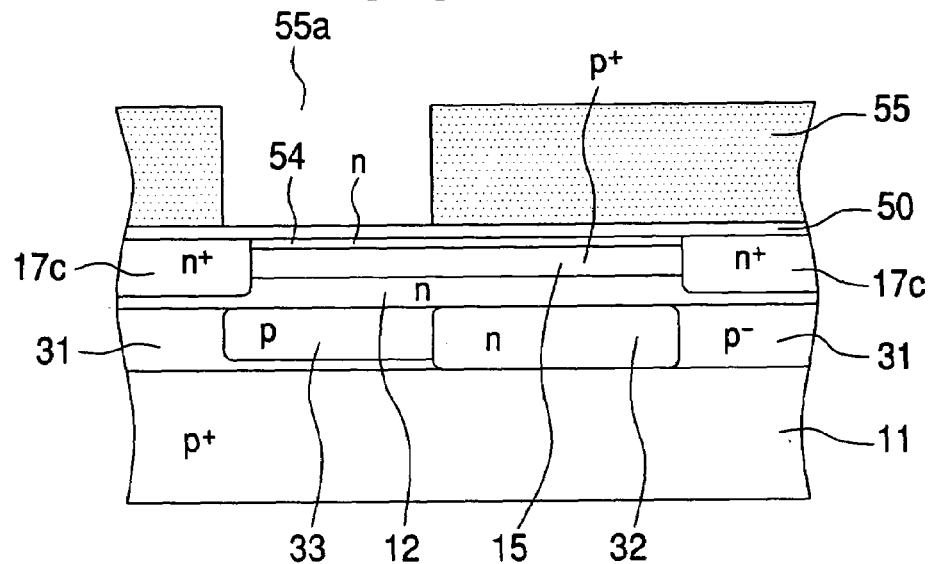
Figure 20B:
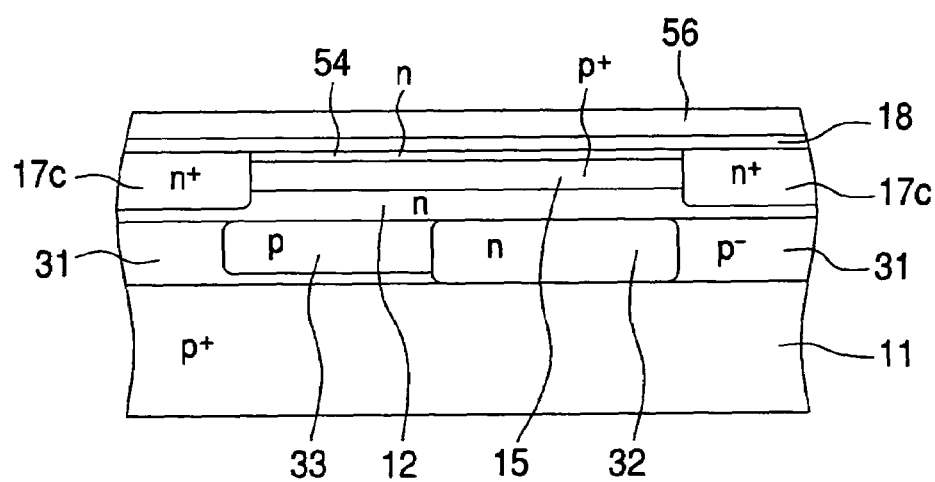
Figure 24A:
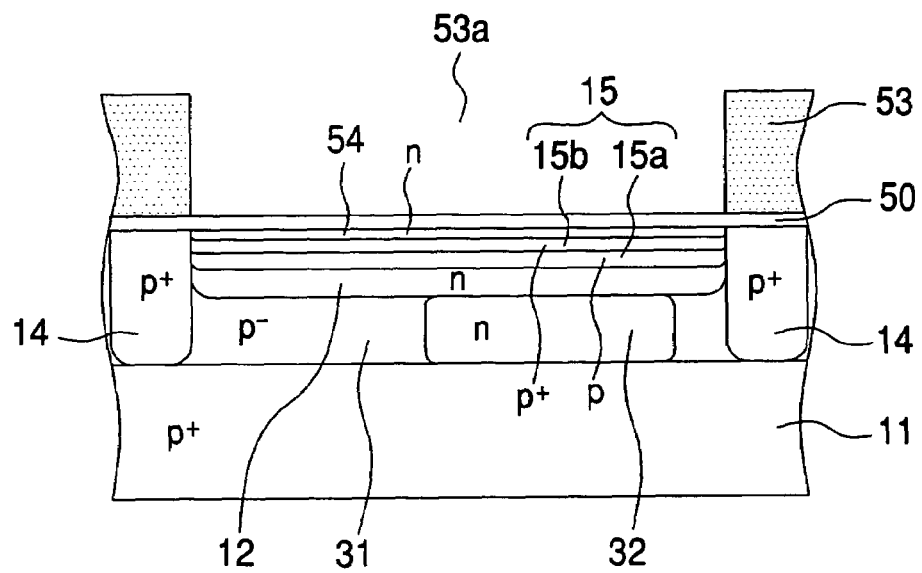
FIG. 24A is a cross sectional view of another embodiment of manufacture process shown in FIG. 9B.
Figure 24B:
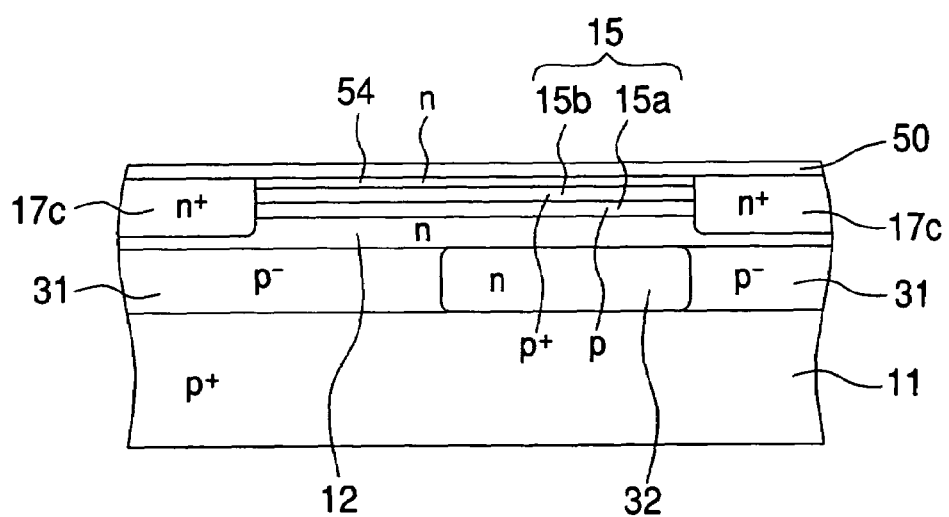
FIG. 24B is a cross sectional view of another embodiment of manufacture process shown in FIG. 19B.
Figure 25:
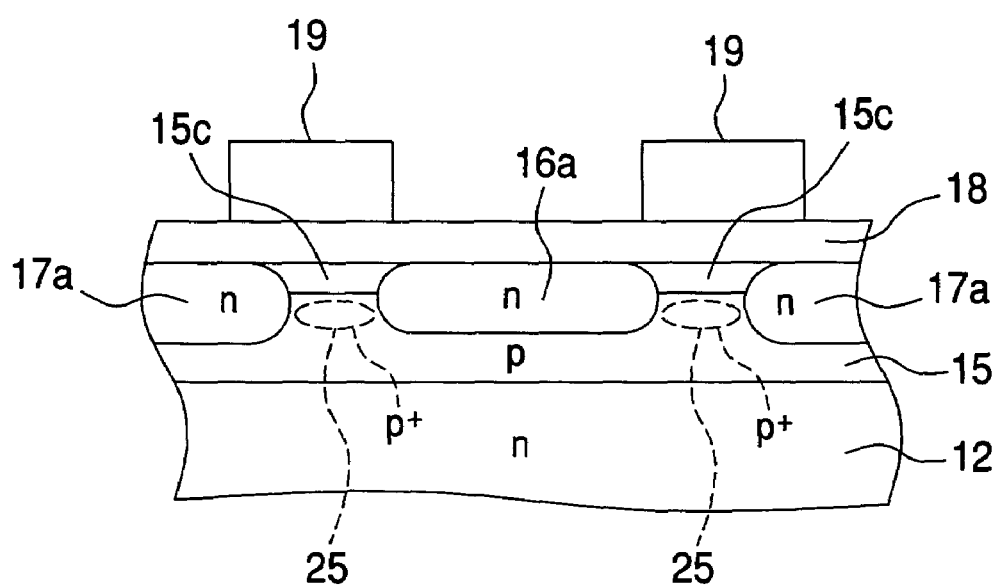
FIG. 25 is a cross sectional view of another embodiment of manufacture process shown in FIGS. 11B and 21B.

In the above embodiment, especially in the manufacture process shown in FIGS. 9B and 19B, the well layer 15 is formed by ion implantation once. Instead, as shown in FIGS. 24A, 24B, after forming the p-type well layer 15a by first ion implantation, p$^+$-type high impurity layer 15b may be formed in the surface of the p-type well layer 15a by the second ion implantation with high impurity density. In that case, the p-type well layer 15a and the p$^+$-type high impurity density layer 15b with different impurity density consist of the well layer 15. By manufacturing the unit pixel in the same manner thereafter, the high impurity density layer 15b remains underneath the channel dope layer 15c so that the hole pocket 25 with higher impurity density may be effectively formed.

Figure 26:
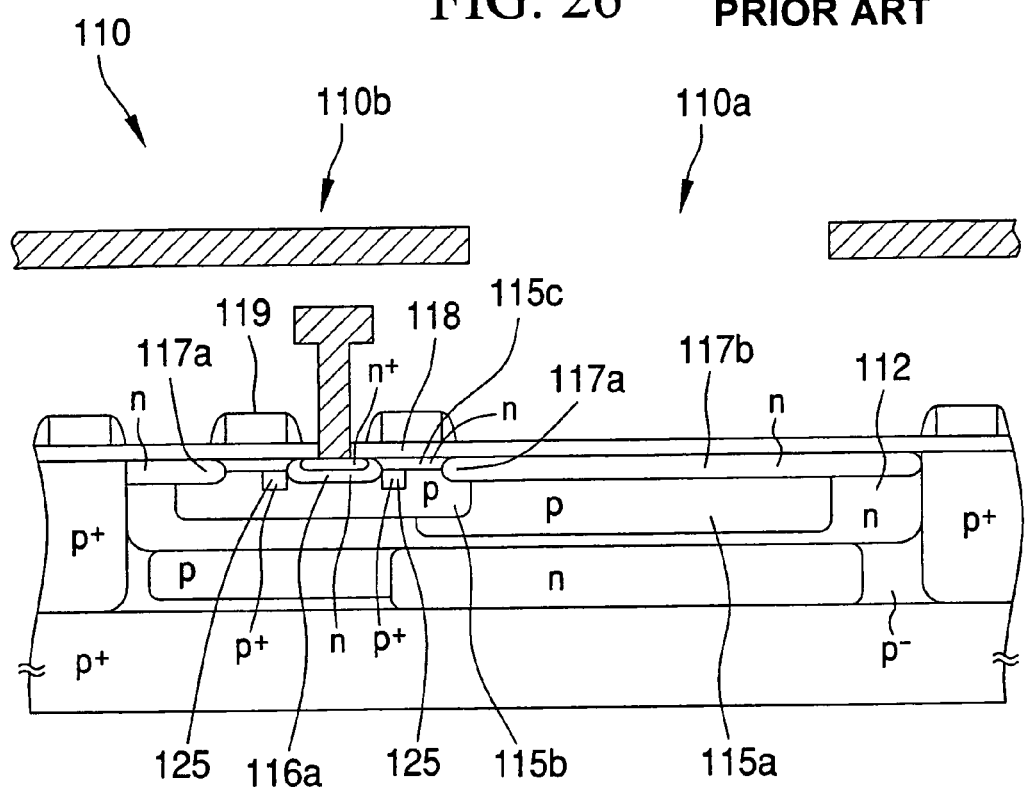
FIG. 26 is a cross section showing the structure of the unit pixel of conventional solid-state imaging device.

In the manufacture process shown in FIGS. 9B, 19B according to the above embodiments, the well layer 15 with single layer is formed by single ion implantation over the region corresponding to the photo-diode 10a and the MOS transistor 10b. Instead, as shown in FIG. 26, the well layer 15 may comprises the two well layers 115a, 115b for the photo-diode 10a region and the MOS transistor 10b region, respectively. Making the impurity density in the well layer 115b higher than that in the well layer 115a can effectively transfer the photo-generated holes to the hole pocket 25.

Figure 21A:
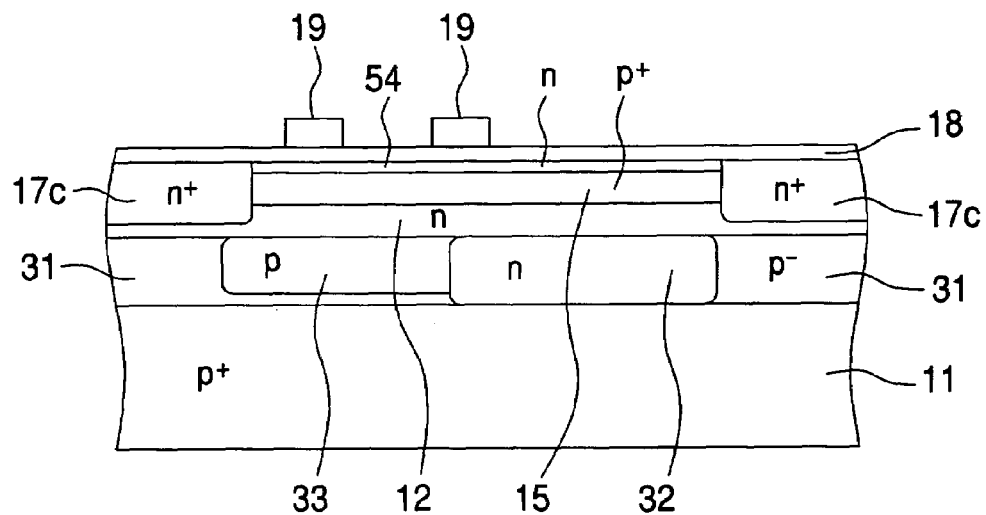
Figure 21B:
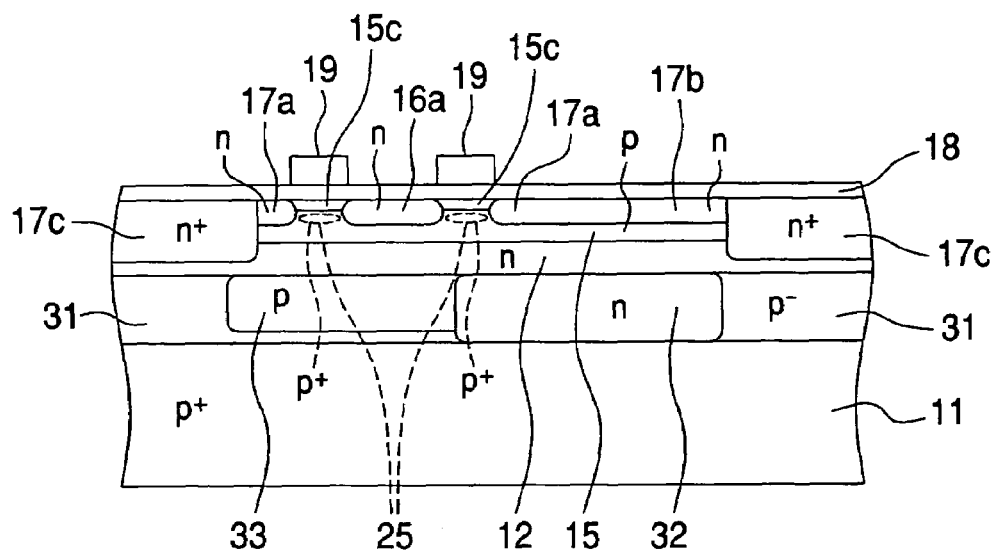
Figure 22A:
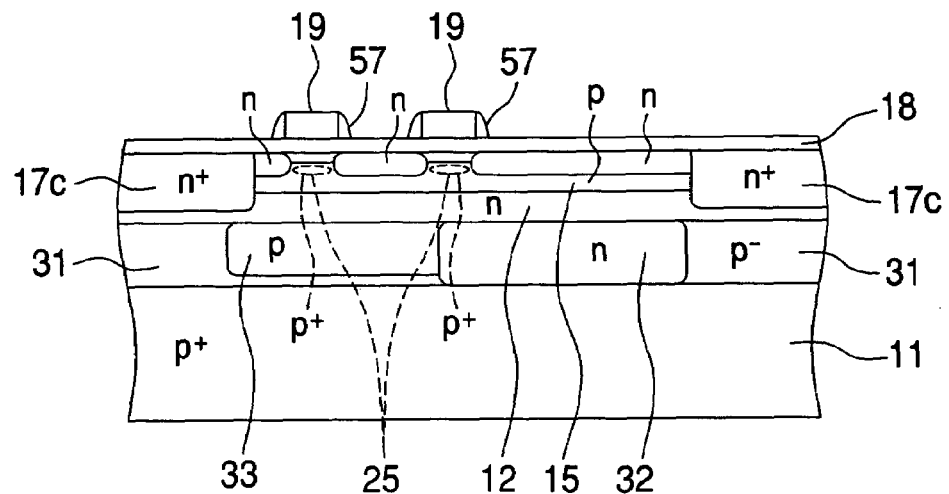
Figure 22B:
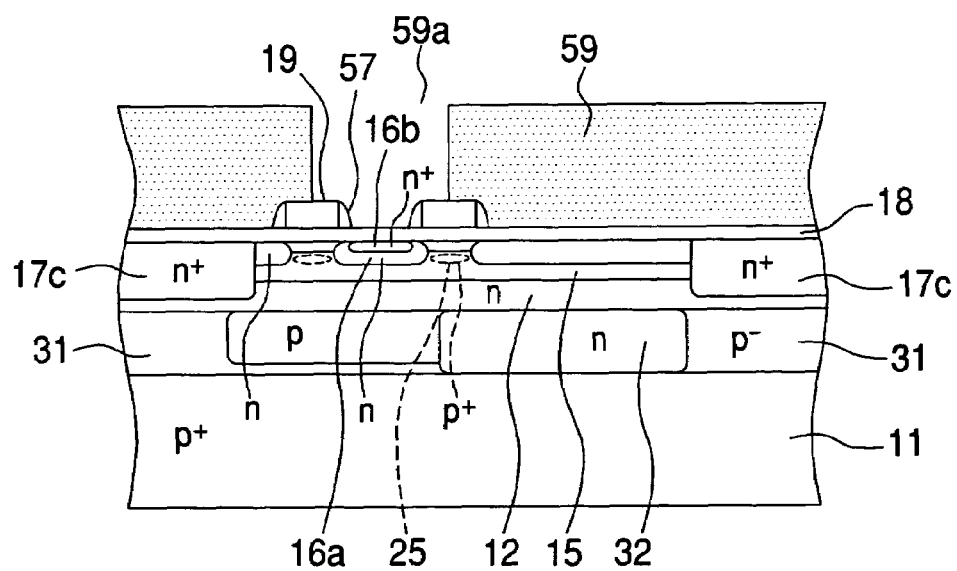
Figure 23:
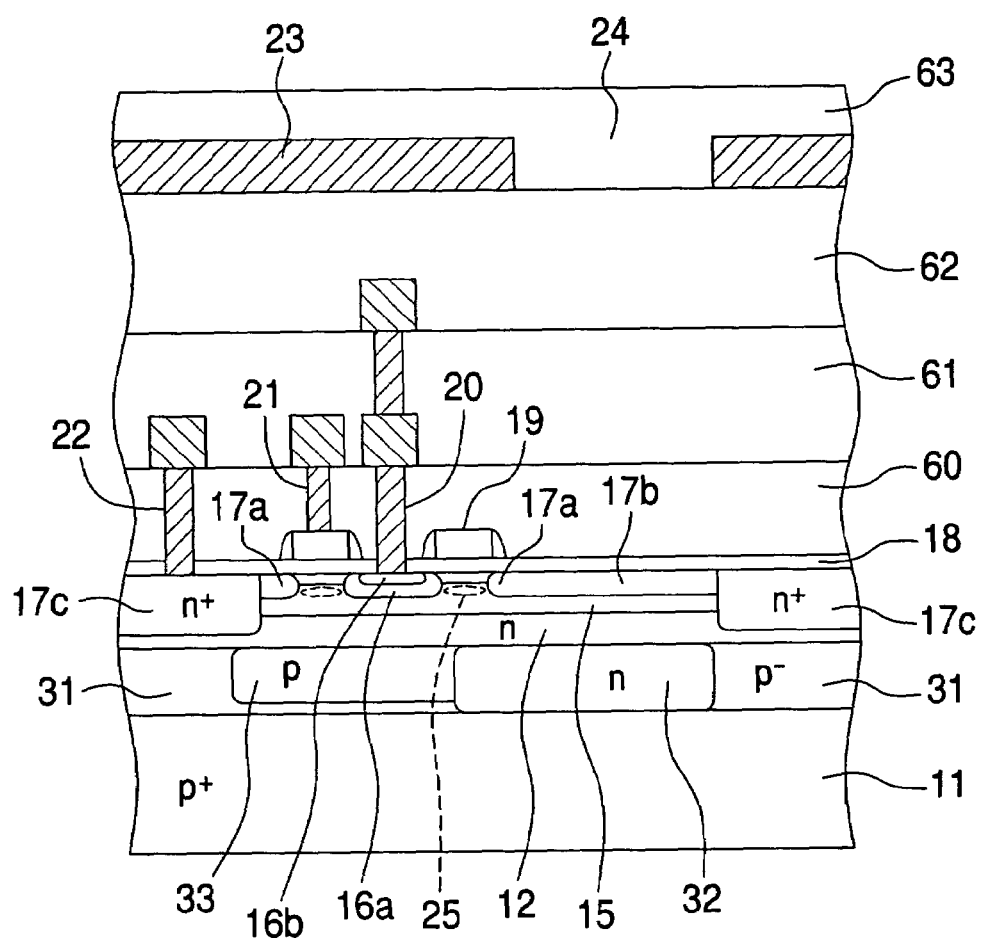

In the manufacture process shown in FIGS. 11B, 21B according to the above embodiments, the source region 16a and the drain region 17a are subject to ion implantation process under the same implantation condition. Instead, the implantation condition may be changed such that the density of ions to be implanted in the drain region 17a becomes higher than that in the source region 16a. Thereby, since the p-type impurity density in the channel dope layer 15 decreases in the region below the channel dope layer 15c and the drain region 17a side, so the self-aligned hole pocket 25 is formed in the source region 16a side and below the gate electrode 19. In that case, the hole pocket 25 is strongly coupled to the source region 16a side, so the image signals according to the potential in the source region 16a becomes less deviated. Thus, the image signals become more stable.

Although the MOS type solid-state imaging device according to the above embodiments has the p-type substrate 14, an n-type substrate is also possible. In that case, the photo-generated charges transferred from the photo-diode 10a to the MOS transistor 10b are electrons, so the conductive type of each region is opposite to the above embodiments (p-type region in the above embodiments changes to n-type region, and vice versa), in order to achieve a similar characteristics.

The above embodiments do not limit the scope of the present invention. Various changes and modifications are possible in the present invention and may be understood to be within the scope of the present invention. In addition, the process to manufacture the unit pixel 10 described above is an example, and it is possible to change the order of the fabrication process.

What is claimed is:

1. A solid-state imaging device in which a second semiconductor layer of opposite conductive type is formed on a first semiconductor layer of one conductive type, the solid-state imaging device being equipped with plural unit pixels formed on the second semiconductor layer, each of the unit pixels comprising:
a photo-diode for generating charges by light illumination, the photo-diode comprising one conductive impurity layer provided in the surface of the second semiconductor layer; and
a photo-detecting transistor coupled to the photo-diode, the photo-detecting transistor comprising:
a gate electrode formed on the second semiconductor layer via an insulation film;
a source region and drain region that are one conductive type and formed in the surface of the second semiconductor layer, the drain region and the impurity layer being connected to each other;
channel dope layer of one conductive type provided in the area between the source and drain regions in the surface of the second semiconductor layer; and
high impurity density region of opposite conductive type formed in the semiconductor layer below the channel dope layer, the high impurity density region being formed by self-alignment to the gate electrode, the photo-detecting transistor generating a signal potential that changes in accordance with the amount of the charges in the high impurity density region.

2. The solid-state imaging device according to claim 1, wherein the source region and the drain region are formed by self-alignment to the gate electrode.

3. The solid-state imaging device according to claim 1, further comprising:
a semiconductor substrate of opposite conductive type on which the first semiconductor layer is formed;
a first buried layer of one conductive type formed in the photo-diode side, the first buried layer being connected to the bottom edge of the first semiconductor layer and buried in the semiconductor substrate; and
a second buried layer of opposite conductive type formed in the photo-detecting transistor side, the second buried layer being connected to the bottom edge of the first semiconductor layer and buried in the semiconductor substrate.

4. The solid-state imaging device according to claim 1, wherein the plural unit pixels are arranged in first and second directions to form a matrix, the solid-state imaging device comprising:
a first line to connect the unit pixels arranged in the first direction to one another;
a second line to connect the unit pixels arranged in the second direction to one another; and
a third line to connect the drain regions of all unit pixels.

5. The solid-state imaging device according to claim 4, further comprising:
a voltage supply circuit to supply voltages to carry out the steps of transferring the charges from the photo-diode to the high impurity density region, generating a first signal potential in the source region according to the charge amount in the high impurity density region, eliminating the charges out of the high impurity density region, and generating a second signal potential in the source region after charge elimination.

6. The solid-state imaging device according to claim 5, further comprising a signal output circuit to output image signal by subtracting the second signal potential from the first signal potential.

7. The solid-state imaging device according to claim 5, further comprising a switch circuit to connecting or disconnecting the first line and the third line, wherein the voltage to the gate electrode is boosted in eliminating the charges by connecting the first line to the third line and by applying a voltage to the source and drain regions simultaneously while keeping the gate electrode at a high impedance state.

8. The solid-state imaging device according to claim 1, further comprising an impurity region of one conductive type that is connected to the impurity layer and the drain region, adjacent unit pixels having the impurity region in common so that the drain regions of all unit pixels are connected to one another via the regions of same conductive type.

* * * * *